US012581801B2

(12) United States Patent
Sun et al.

(10) Patent No.: US 12,581,801 B2
(45) Date of Patent: Mar. 17, 2026

(54) DISPLAY SUBSTRATE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Kaipeng Sun, Beijing (CN); Binyan Wang, Beijing (CN); Jianchang Cai, Beijing (CN); Chao Wu, Beijing (CN); Yue Long, Beijing (CN); Yao Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 890 days.

(21) Appl. No.: 17/790,207

(22) PCT Filed: Sep. 10, 2021

(86) PCT No.: PCT/CN2021/117747
§ 371 (c)(1),
(2) Date: Jun. 30, 2022

(87) PCT Pub. No.: WO2022/083348
PCT Pub. Date: Apr. 28, 2022

(65) Prior Publication Data
US 2023/0030745 A1     Feb. 2, 2023

(30) Foreign Application Priority Data
Oct. 19, 2020    (CN) ........................... 202011119110.1

(51) Int. Cl.
H10K 59/121     (2023.01)
H10D 86/40     (2025.01)
(Continued)

(52) U.S. Cl.
CPC ....... H10K 59/1213 (2023.02); H10D 86/441 (2025.01); H10D 86/481 (2025.01);
(Continued)

(58) Field of Classification Search
CPC .... H10D 86/60; H10D 86/441; H10D 86/481; H10D 86/411; H10K 50/865;
(Continued)

(56) References Cited

U.S. PATENT DOCUMENTS 11,373,599 B1 *    6/2022    Chen .................... H10K 59/131
2007/0296882 A1    12/2007    Huang et al.
(Continued)

FOREIGN PATENT DOCUMENTS

CN        108470539 A      8/2018
CN        108878476 A      11/2018
(Continued)

OTHER PUBLICATIONS

Chinese First Office Action in Chinese App. No. 202011119110.1; Mailing Date: Mar. 13, 2025.

*Primary Examiner* — Shaheda A Abdin
(74) *Attorney, Agent, or Firm* — Dilworth & Barrese, LLP.; Michael J. Musella, Esq.

(57) ABSTRACT

A display substrate and a display device are provided. The display substrate includes a base substrate; a display region, on the base substrate and including a plurality of pixel driving units, each of the plurality of pixel driving units includes a threshold compensation transistor, a first light-emitting control transistor, an active layer of the threshold compensation transistor includes a first channel region cor- (Continued)

PO responding to the first gate electrode, a second channel region corresponding to the second gate electrode, and an intermediate region between the first channel region and the second channel region; and a plurality of light shielding patterns.

19 Claims, 19 Drawing Sheets

(51) Int. Cl.
H10D 86/60 (2025.01)
H10K 59/131 (2023.01)

(52) U.S. Cl.
CPC ......... H10D 86/60 (2025.01); H10K 59/1216 (2023.02); H10K 59/131 (2023.02)

(58) Field of Classification Search
CPC ............. H10K 59/1216; H10K 59/131; H10K 59/1213; H10K 59/126; G09G 3/3225
See application file for complete search history.

(56) References Cited

U.S. PATENT DOCUMENTS

| | | | | |
|---|---|---|---|---|
| 2009/0174923 A1* | 7/2009 | Nozawa | ............... | H10K 59/128 |
| | | | | 313/505 |
| 2017/0033171 A1* | 2/2017 | Kim | ..................... | G09G 3/3233 |
| 2017/0358637 A1* | 12/2017 | Lee | ....................... | G06F 3/0446 |

FOREIGN PATENT DOCUMENTS

| | | | |
|---|---|---|---|
| CN | 109524447 | A | 3/2019 |
| CN | 111429843 | A | 7/2020 |
| CN | 211150599 | U | 7/2020 |
| CN | 111681549 | A | 9/2020 |
| CN | 113013218 | A | 6/2021 |
| JP | 2000330138 | A | 11/2000 |

* cited by examiner

P1     P2     P3

T3 sp1   T3   sp2  T3   sp3

PO

SCP

LY1

LY2

LY3

SCP

CP

LY1

ELVDD3

LY2

LY3

SCP

CP

LY1

LY2

LY3

SCP

CP

LY1

LY2

LY3

DISPLAY SUBSTRATE AND DISPLAY APPARATUS

CROSS-REFERENCE TO RELATED APPLICATION

The present application claims priority of Chinese Patent Application No. 202011119110.1, filed on Oct. 19, 2020, and the entire content disclosed by the Chinese patent application is incorporated herein by reference as part of the present application for all purposes under the U.S. law.

TECHNICAL FIELD

The embodiments of the present disclosure relate to a display substrate and a display device.

BACKGROUND

Organic light-emitting diode (OLED) display devices have the advantages of thin thickness, light weight, wide viewing angle, active light emission, continuously adjustable light emission color, low cost, fast response speed, low energy consumption, low driving voltage, wide operating temperature range, simple production process, high luminous efficiency, and flexible display, and therefore, the OLED display devices are more and more widely used in display fields such as mobile phones, tablet computers, and digital cameras.

SUMMARY

At least one of embodiment of the present disclosure discloses display substrate, comprising: a base substrate; a display region, on the base substrate and comprising a plurality of pixel driving units arranged in a plurality of rows and a plurality of columns, wherein each of the plurality of pixel driving units comprises a threshold compensation transistor, a first light-emitting control transistor, and a storage capacitor, and the threshold compensation transistor is connected to the first light-emitting control transistor and the storage capacitor, respectively, the threshold compensation transistor comprises a first gate electrode and a second gate electrode, and an active layer of the threshold compensation transistor comprises a first channel region corresponding to the first gate electrode, a second channel region corresponding to the second gate electrode, and an intermediate region between the first channel region and the second channel region, the first channel region and the second channel region are connected through the intermediate region; and a plurality of light shielding patterns, wherein each light shielding pattern comprises a first end and a second end, first ends of the plurality of light shielding patterns are used for receiving a voltage signal, a second end of at least one light shielding pattern in the plurality of light shielding patterns at least partially overlaps with an intermediate region of a threshold compensation transistor of an outermost first pixel driving unit of at least one row of pixel driving units in a direction perpendicular to the base substrate.

For example, the display substrate provided by at least one embodiment of the present disclosure further comprises: a peripheral region at least partially surrounding the display region, a plurality of first power lines in the display region, and a first power line edge line in the peripheral region, the plurality of first power lines extend along a first direction and are configured to be connected to respective columns of pixel driving units in the plurality of pixel driving units, so as to provide a first power voltage to the respective columns of pixel driving units, respectively; the first power line edge line is configured to be connected to the plurality of first power lines, so as to provide the first power voltage to the plurality of first power lines; the voltage signal comprises the first power voltage.

For example, in the display substrate provided by at least one embodiment of the present disclosure, the plurality of light shielding patterns comprise a plurality of first light shielding patterns; the first power line edge line comprises a first sub-conducting line and a second sub-conducting line that extend along the first direction and are arranged oppositely, and a third sub-conducting line and a fourth sub-conducting line that extend along a second direction and are arranged oppositely; the first sub-conducting line is on a side of the first pixel driving unit close to the plurality of pixel driving units; first ends of the plurality of first light shielding patterns are connected to the first sub-conducting line to receive the first power voltage, and a second end of at least one first light shielding pattern of the plurality of first light shielding patterns at least partially overlaps with the intermediate region of the threshold compensation transistor of the first pixel driving unit of the at least one row of pixel driving units in the direction perpendicular to the base substrate.

For example, the display substrate provided by at least one embodiment of the present disclosure further comprises: a plurality of signal lines respectively electrically connected to the plurality of pixel driving units, a first electrode pattern in the peripheral region and electrically connected to at least one signal line of the plurality of signal lines, and a second electrode pattern in the peripheral region, wherein the first electrode pattern and the second electrode pattern are on a side of the peripheral region close to the outermost first pixel driving unit of the at least one row of pixel driving units; and the first electrode pattern and the second electrode pattern at least partially overlap in the direction perpendicular to a board surface of the base substrate and are insulated.

For example, in the display substrate provided by at least one embodiment of the present disclosure, the first electrode pattern is connected to the signal line through a hole to compensate a load capacitance of the signal line; the second electrode pattern is connected to the first power line through a hole to receive the first power voltage.

For example, in the display substrate provided by at least one embodiment of the present disclosure, the plurality of light shielding patterns further comprise at least one second light shielding pattern; a first end of the at least one second light shielding pattern and the second electrode pattern are connected with each other and are formed integrally, a second end of the at least one second light shielding pattern at least partially overlaps with an intermediate region of at least one threshold compensation transistor of a first pixel driving unit of at least one row of pixel driving units adjacent to the second electrode pattern in the second direction in the direction perpendicular to the base substrate.

For example, in the display substrate provided by at least one embodiment of the present disclosure, a count of pixels of at least one row of pixel driving units adjacent to the first electrode pattern or the second electrode pattern in the second direction is smaller than a count of pixels of a row of pixel driving units adjacent to the first electrode pattern or the second electrode pattern in the first direction.

For example, in the display substrate provided by at least one embodiment of the present disclosure, an extending direction of the first light shielding pattern is different from an extending direction of the first sub-conducting line.

For example, in the display substrate provided by at least one embodiment of the present disclosure, the plurality of signal lines comprise a data line or a gate line.

For example, in the display substrate provided by at least one embodiment of the present disclosure, an orthographic projection of the data line on the base substrate at least partially overlaps with an orthographic projection of the storage capacitor on the base substrate.

For example, the display substrate provided by at least one embodiment of the present disclosure, further comprises a power connection line on a side of the peripheral region close to the outermost first pixel driving unit of the at least one row of pixel driving units; the power connection line is connected to the first power line through a hole to receive the first power voltage; the plurality of light shielding patterns further comprise at least one third light shielding pattern; a first end of the at least one third light shielding pattern is connected to the power connection line; a second end of the at least one third light shielding pattern at least partially overlaps with an intermediate region of a threshold compensation transistor of a first pixel driving unit of at least one row of pixel driving units adjacent to the power connection line in the second direction in the direction perpendicular to the base substrate.

For example, in the display substrate provided by at least one embodiment of the present disclosure, a count of pixels of each row of pixel driving units adjacent to the power connection line in the second direction is smaller than a count of pixels of a row of pixel driving units adjacent to the power connection line in the first direction.

For example, the display substrate provided by at least one embodiment of the present disclosure further comprises a first transfer electrode, wherein a first end of the first transfer electrode is connected to the power connection line through a hole, and a second end of the first transfer electrode is connected to the at least one third light shielding pattern through a hole.

For example, in the display substrate provided by at least one embodiment of the present disclosure, a first end of the at least one light shielding pattern of the plurality of light shielding patterns is respectively connected to a first power line corresponding to the first pixel driving unit on the outmost side of the at least one row of pixel driving units to receive the first power voltage as the voltage signal.

For example, the display substrate provided by at least one embodiment of the present disclosure further comprises: an initialization signal line configured to provide an initialization signal to the plurality of pixel driving units; the voltage signal comprises the initialization signal.

For example, in the display substrate provided by at least one embodiment of the present disclosure, each of the plurality of pixel driving units further comprises a first reset transistor and a second reset transistor; a first electrode of the first reset transistor is connected to the initialization signal line to receive the initialization signal, a second electrode of the first reset transistor is connected to the threshold compensation transistor, and a gate electrode of the first reset transistor is connected to a first reset signal line to receive a first reset signal; and a first electrode of the second reset transistor is connected to the initialization signal line to receive the initialization signal, a second electrode of the second reset transistor is connected to the first light-emitting control transistor, and a gate electrode of the second reset transistor is connected to a second reset signal line to receive a second reset signal.

For example, the display substrate provided by at least one embodiment of the present disclosure further comprises: a plurality of second transfer electrodes, a first insulation layer, a second insulation layer, and a third insulation layer; first ends of the plurality of second transfer electrodes are respectively connected to the initialization signal line to receive the initialization signal, second ends of the plurality of second transfer electrodes are respectively connected to first electrodes of first reset transistors of the outermost first pixel driving units of the respective rows of pixel driving units through holes penetrating through the first insulation layer, the second insulation layer, and the third insulation layer; and first electrodes of first reset transistors of the outermost first pixel driving units are connected to the first ends of the plurality of light shielding patterns through holes penetrating through the first insulation layer and the second insulation layer, respectively.

For example, in the display substrate provided by at least one embodiment of the present disclosure, the pixel driving unit further comprises a driving transistor; an active layer of the first reset transistor and an active layer of the driving transistor at least partially overlap with the first power line.

For example, in the display substrate provided by at least one embodiment of the present disclosure, a length of a light shielding pattern corresponding to the outermost first pixel driving unit of each row of pixel driving units is greater than a length of a light shielding pattern corresponding to a pixel driving unit except the outermost first pixel driving unit of each row of pixel driving units.

For example, in the display substrate provided by at least one embodiment of the present disclosure, light shielding patterns corresponding to the pixel driving units except the outermost first pixel driving unit of each row of pixel driving units are connected to first power lines corresponding to pixel driving units in each column, respectively.

At least one embodiment of the present disclosure also provides a display device including the display substrate provided by any embodiment of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The OLED display technology has strong competitiveness in displays due to its advantages of wide viewing angle, high contrast ratio, fast response, low power consumption, foldable, and flexible. In recent years, the flexible display technology has developed rapidly, and the flexible display technology has spread from mobile phone products, in which the flexible display technology is mainly used, to small-sized products such as wristbands and watches. OLED small-sized products have many advantages such as easy portability and good display effect, and are favored. On a small-sized display screen, if the display brightness is slightly uneven, it will be easier to be found during the customer experience, which will greatly affect the customer experience. Therefore, the uniformity of the display brightness of the screen is more important.

Figure 1:
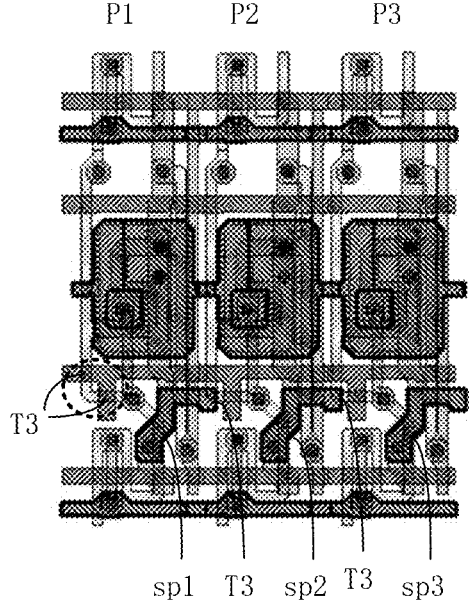
FIG. 1 is a schematic plan view of a display substrate.

As shown in FIG. 1, in a 7T1C circuit structure, a conductive channel of a double-gate transistor (threshold compensation transistor) T3 is generally routed through a gate insulating layer (Gate2) during the layout design, the power voltage signal connected to an adjacent left pixel driving unit shields the conductive channel of the transistor T3, thereby preventing the transistor T3 from leaking, ensuring that the 7T1C operates better, and preventing the screen from darkening due to the current jump, thus resulting in that the brightness of the screen is uneven, commonly known as the "small pepper" design. For example, the "small pepper" design sp1 that shields the transistor T3 of the pixel driving unit P2 in the second column is connected to the first power line of the pixel driving unit P1 in the first column to receive the power voltage signal of the pixel driving unit in the first column, the "small pepper" design sp2 that shields the transistor T3 of the pixel driving unit P3 in the third column is connected to the first power line of the pixel driving unit P2 in the second column to receive the power voltage signal of the pixel driving unit in the second column, and the "small pepper" design sp3 that shields the transistor T3 of the pixel driving unit in the fourth column (not shown) is connected to the first power line of the pixel driving unit P3 in the third column to receive the power voltage signal of the pixel driving unit in the third column.

Such a "small pepper" design is very common in the design of the 7T1C pixel circuit in the display region, however, due to the asymmetry of the 7T1C pixel circuit, the pixel driving unit P1 in the first column from the left of the display region does not have a "small pepper" design (as shown in FIG. 1), and therefore, the channel of the transistor T3 in the 7T1C circuit in the first column cannot be shielded, so that the brightness corresponding to the pixel circuits in this column will be darker as a whole, thereby causing the uniformity of the screen to be worse.

At least one embodiment of the present disclosure provides a display substrate, comprising: a base substrate; a display region, arranged on the base substrate and comprising a plurality of pixel driving units arranged in a plurality of rows and a plurality of columns, where each of the plurality of pixel driving units comprises a threshold compensation transistor, a first light-emitting control transistor, and a storage capacitor, and the threshold compensation transistor is connected to the first light-emitting control transistor and the storage capacitor, respectively, the threshold compensation transistor comprises a first gate electrode and a second gate electrode, and an active layer of the threshold compensation transistor comprises a first channel region corresponding to the first gate electrode, a second channel region corresponding to the second gate electrode, and an intermediate region between the first channel region and the second channel region, the first channel region and the second channel region are connected through the intermediate region; and a plurality of light shielding patterns, where each light shielding pattern comprises a first end and a second end, first ends of the plurality of light shielding patterns are used for receiving a voltage signal, a second end of at least one light shielding pattern in the plurality of light shielding patterns at least partially overlaps with an intermediate region of a threshold compensation transistor of an outermost first pixel driving unit of at least one row of pixel driving units in a direction perpendicular to the base substrate.

The display substrate provided by the embodiment of the present disclosure can add a "small pepper" design structure in the first column of pixel driving units at the outermost side of the display region, so as to reduce the leakage capability of the double-gate transistor and avoid dark lines on the left border of the screen, thereby improving the uniformity of the brightness of the display screen and improving the display quality of the display panel.

The embodiments of the present disclosure will be described in detail below with reference to the accompanying drawings. It should be noted that the same reference numerals will be used in different drawings to refer to the same elements that have been described.

Figure 2A:
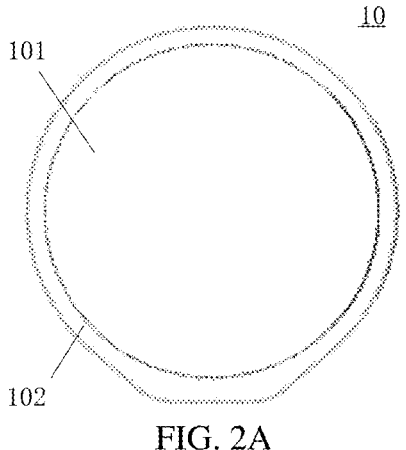
FIG. 2A is a schematic plan view of a display substrate according to some embodiments of the present disclosure.

FIG. 2A is a schematic plan view of a display substrate provided by some embodiments of the present disclosure. As shown in FIG. 2A, the display substrate 10 has a display region 101 and a peripheral region 102 at least partially surrounding (e.g., completely surrounding) the display region 101. For example, a shape of the display region 101 of the display substrate 10 may be a circle, and the peripheral region 102 surrounds the display region 101 and has an approximate circular outline, so that the display substrate 10 has an approximately circular shape to satisfy the actual needs of users for the display substrates having different shapes.

Figure 2B:
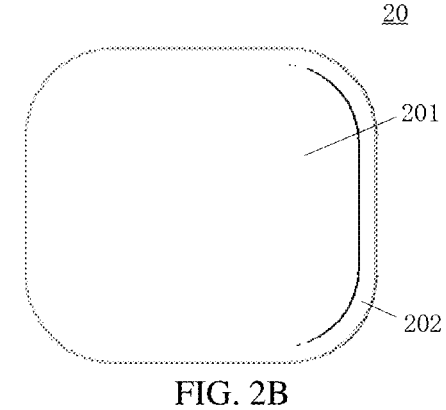
FIG. 2B is a schematic plan view of another display substrate according to some embodiments of the present disclosure.

It should be noted that, the embodiments of the present disclosure do not limit the specific shape of the display substrate. For example, FIG. 2B is a schematic plan view of another display substrate provided by some embodiments of the present disclosure. As shown in FIG. 2B, the display substrate 20 has a display region 201 and a peripheral region 202 at least partially surrounding (e.g., completely surrounding) the display region 201. For example, the shape of the display region 201 of the display substrate 20 may be a square with rounded corners, and the peripheral region 202 surrounds the display region 201 and has the same outline as the display region 201, so that the display substrate 20 has a square with rounded corners. In some other embodiments of the present disclosure, the display substrate may also be in a regular shape such as an ellipse, a fan-shape, a triangle, a rhombus, a pentagon, etc., or may be in other suitable irregular shapes, and the embodiments of the present disclosure do not limit this.

Figure 3:
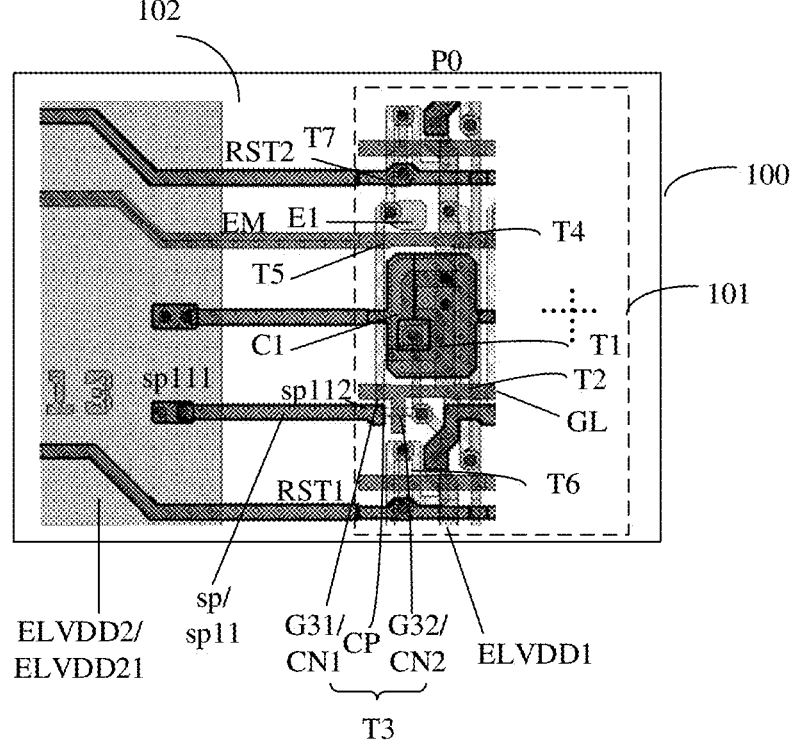
FIG. 3 is a schematic diagram of a display substrate provided by some embodiments of the present disclosure.
Figure 4:
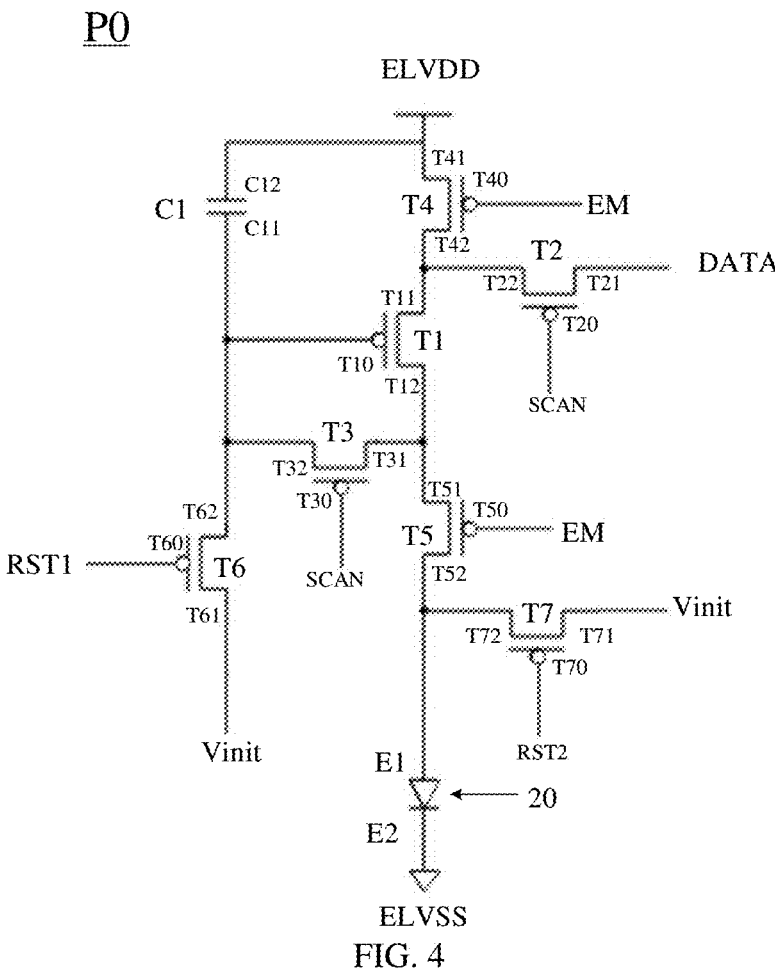
FIG. 4 is a schematic diagram of a circuit structure of a pixel driving unit provided by some embodiments of the present disclosure.

FIG. 3 is a schematic diagram of a display substrate provided by at least one embodiment of the present disclosure. FIG. 4 is a schematic diagram of a circuit structure of a pixel driving unit provided by at least one embodiment of the present disclosure. FIGS. 5A-5D are respectively plan views of a semiconductor pattern, a first conductive layer, a second conductive layer, and a third conductive layer of the display substrate shown in FIG. 3. For example, as shown in FIG. 3, the display substrate 10 includes a base substrate 100. The display region 101 includes a plurality of pixel driving units P0 arranged in an array on the base substrate 100. It should be noted that only one pixel driving unit P0 is shown in FIG. 3 for example, and the display region 101 also includes a plurality of rows and a plurality of columns of pixel driving units P0, and the embodiments of the present disclosure do not limit this.

Figure 5A:
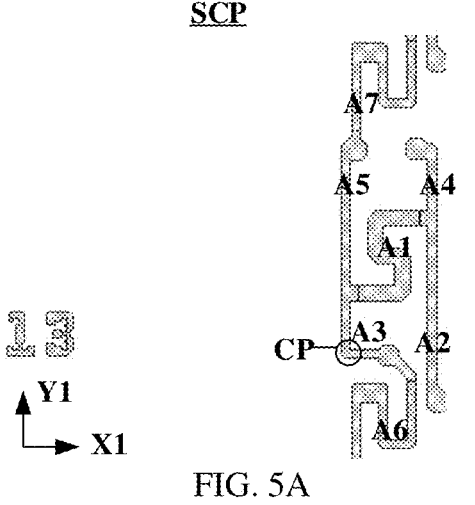
FIG. 5A is a plan view of a semiconductor pattern of the display substrate shown in FIG. 3.
Figure 5B:
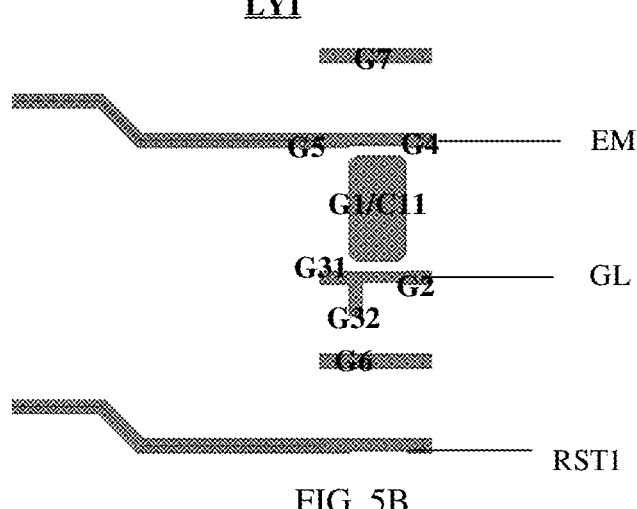
FIG. 5B is a plan view of a first conductive layer of the display substrate shown in FIG. 3.

For example, as shown in FIG. 4, each of the plurality of pixel driving units P0 includes a threshold compensation transistor T3, a first light-emitting control transistor T5, and a storage capacitor C1, and the threshold compensation transistor T3 is respectively connected to the first light-emitting control transistor T5 and the storage capacitor C1. The first light-emitting control transistor T5 is connected to a light-emitting element 20. For example, as shown in FIG. 3, FIG. 5A, and FIG. 5B, the threshold compensation transistor T3 includes a first gate electrode G31 and a second gate electrode G32, and an active layer of the threshold compensation transistor T3 includes a first channel region CN1 corresponding to the first gate electrode g31, a second channel region CN2 corresponding to the second gate electrode G32, and an intermediate region CP between the first channel region CN1 and the second channel region CN2, the first channel region CN1 and the second channel region CN2 are connected through the intermediate region CP.

Figure 5C:
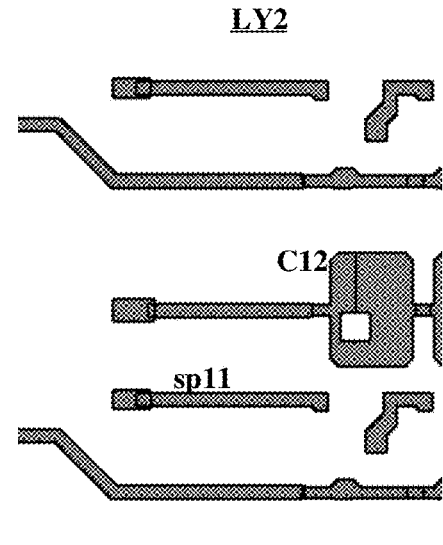
FIG. 5C is a plan view of a second conductive layer of the display substrate shown in FIG. 3.

As shown in FIG. 3 and FIG. 5C, the display substrate 10 further includes a plurality of light shielding patterns sp (the figures only exemplarily show a light shielding patterns sp corresponding to one pixel driving unit, and the embodiments of the present disclosure are not limited thereto). For example, each light shielding pattern sp includes a first end sp111 and a second end sp112, the first ends sp111 of the plurality of light shielding patterns sp are used for receiving a voltage signal, and the second end sp112 of at least one light shielding pattern sp in the plurality of light shielding patterns sp at least partially overlaps with the intermediate region of the threshold compensation transistor of the outermost first pixel driving unit of the at least one row of pixel driving units in a direction perpendicular to the base substrate. For example, at least some of the second ends sp112 of the plurality of light shielding patterns sp at least partially overlaps with the intermediate region CP of the threshold compensation transistor T3 of the outermost first pixel driving unit (i.e., the leftmost column of pixel driving units in the display region 101) of at least one row of pixel driving units in the direction perpendicular to the base substrate 10, so as to achieve to shield the threshold compensation transistors T3 of the leftmost column of pixel driving units in the display region 101, reduce the leakage capability of the dual-gate transistor, and avoid dark lines on the left border of the screen, thereby improving the uniformity of the brightness of the display screen and improving the display quality of the display panel.

It should be noted that the outermost first pixel driving unit of each row of pixel driving units is the pixel driving unit located in the outermost first column of each row of pixel driving units, that is, the first column pixel driving unit is relative to each row of pixel driving units, and for the arrangement of the all pixel driving units, the first column pixel driving unit represents the pixel unit located on the outermost side, it is possible that the first pixel driving units of all rows in the column direction are not located in the same column, however, because the first pixel driving units of all rows are located at the outermost side of the respective rows of pixel driving units, the first pixel driving units of all rows are all called the first column pixel driving units. The following description will be given by taking the example that the first column pixel driving unit of each row represents the first pixel driving unit in each row as an example, and the following embodiments are the same as those described herein and will not be repeated.

For example, the length of the light shielding pattern corresponding to the outermost first column pixel driving unit of each row of pixel driving units is greater than the length of the light shielding pattern corresponding to each pixel driving unit, except the outermost first column pixel driving unit, of each row of pixel driving units.

It should be noted that the light shielding pattern in FIG. 3 is the "small pepper" design described above. Therefore, the display substrate provided by the embodiments of the present disclosure can add a "small pepper" design structure into the pixel driving unit in the first column from the left of the display region, so as to reduce the leakage capability of the double-gate transistor and avoid dark lines on the left border of the screen, thereby improving the uniformity of the brightness of the display screen and improving the display quality of the display panel.

Figure 5D:
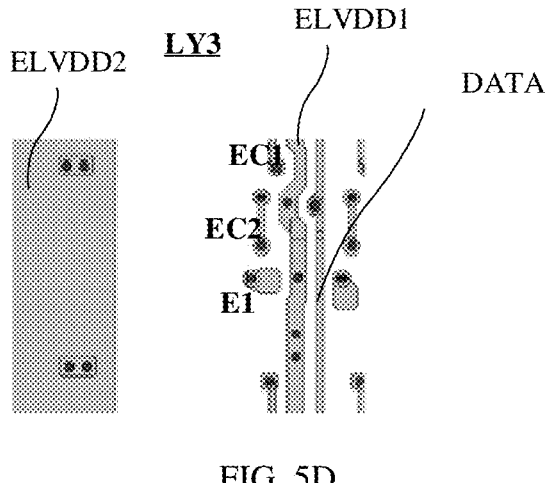
FIG. 5D is a plan view of a third conductive layer of the display substrate shown in FIG. 3.

FIG. 5A is a plan view of a semiconductor pattern of the display substrate shown in FIG. 3; FIG. 5B is a plan view of a first conductive layer of the display substrate shown in FIG. 3; FIG. 5C is a plan view of a second conductive layer of the display substrate shown in FIG. 3; and FIG. 5D is a plan view of a third conductive layer of the display substrate shown in FIG. 3. The display substrate 10 according to the embodiment of the present disclosure will be described in detail below with reference to FIGS. 3 to 5D.

For example, as shown in FIGS. 5A-5D, the first conductive layer LY1 includes a gate line GL, the second conductive layer LY2 includes a second electrode plate C12 of the storage capacitor C1, and the third conductive layer LY3 includes a first power line ELVDD1. For example, in the direction perpendicular to the base substrate 100, a first insulation layer (not shown in the drawing) is located between the active layer SCP and the first conductive layer LY1, and a second insulation layer (not shown in the drawing) is located between the gate line GL (i.e., the first conductive layer LY1) and the second conductive layer LY2, and a third insulation layer is located between the second electrode plate C12 (i.e., the second conductive layer LY2) of the storage capacitor C1 and the third conductive layer LY3.

For example, the light shielding pattern corresponding to each pixel driving unit except the outermost first column pixel driving unit is respectively connected to the first power line ELVDD corresponding to each column of pixel driving units.

For example, as shown in FIG. 4, the pixel driving unit includes a driving transistor T1, a data writing transistor T2, a threshold compensation transistor T3, a second light-emitting control transistor T4, a first light-emitting control transistor T5, a first reset transistor T6, a second reset transistor T7, a storage capacitor C1, and a light-emitting element 20. For example, each of transistors and capacitors includes a first electrode and a second electrode. For the introduction of the connection relationship and the working principle of the pixel driving unit, reference may be made to the description in the art, and details are not repeated here.

Figure 8A:
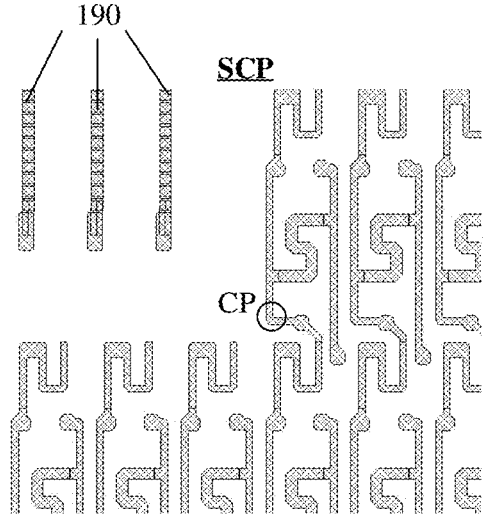
FIG. 8A is a plan view of a semiconductor pattern of the display substrate shown in FIG. 7.

For example, as shown in FIG. 8A, active layers A6, A3, A5, and A7 of the first reset transistor T6, the threshold compensation transistor T3, the first light-emitting control transistor T5, and the second reset transistor T7 are located in the first semiconductor layer, active layers A2 and A4 of the data writing transistor T2 and the second light-emitting control transistor T4 are located in the second semiconductor layer, and the first semiconductor layer and the second semiconductor layer are connected through the active layer A1 of the driving transistor T1 and formed integrally.

For example, as shown in FIGS. 3 and 5A, the active layer A1 of the driving transistor T1 is located on an imaginary line of the active layer A6 of the first reset transistor T6 in the first direction Y1, the active layers A3 and A2 of the threshold compensation transistor T3 and the data writing transistor T2 are respectively located on the left side and the right side of the active layer A1 of the driving transistor T1, and both are located on the side of the active layer A1 of the driving transistor T1 close to the active layer A6 of the first reset transistor T6, that is, in the second direction Y1, the active layers A3 and A2 of the threshold compensation transistor T3 and the data writing transistor T2 are located above the active layer A1 of the driving transistor T1, the active layers A5 and A4 of the first light-emitting control transistor T5 and the second light-emitting control transistor T4 are respectively located on both sides of the active layer A1 of the driving transistor T1, and are located on the side of the active layer A1 of the driving transistor T1 away from the active layer A6 of the first reset transistor T6, for example, in the second direction Y1, are located below the active layer A1 of the driving transistor T1.

It should be noted that "up", "down", "left", and "right" in the embodiments of the present disclosure are respectively described with respect to the up, down, left, and right in the drawings, and the display substrate is not limited, and can be determined according to the actual situation.

For example, as shown in FIGS. 3 and 5B, the active layer A7 of the second reset transistor T7 is located on the side of the active layer A5 of the first light-emitting control transistor T5 away from the active layer of the threshold compensation transistor T3, the threshold compensation transistor T3 includes a first gate electrode G31 extending along the second direction X1 and a second gate electrode G32 extending along the first direction Y1, the first gate electrode G31, the gate electrode G5 of the first light-emitting control transistor T5 extending along the second direction X2, and the gate electrode G7 of the second reset transistor T7 are arranged side by side in the first direction Y1; and the gate electrode G2 of the data writing transistor T2 and the gate electrode G4 of the second light-emitting control transistor T4 extend along the second direction X1 and are arranged side by side in the first direction Y1.

For example, the gate electrode G6 of the first reset transistor T6 and the gate electrode G1 of the driving transistor T1 extend along the second direction X1 and are arranged side by side in the first direction Y1, and the gate electrode G1 of the driving transistor T1 and the first electrode plate C11 of the storage capacitor C1 are integrally formed.

For example, the display substrate further includes the gate line GL extending along the second direction Y1, a light-emitting control signal line EM, a first reset signal line RST1, and a second reset signal line (not shown in the figure, the second reset signal line is integrally formed with the gate electrode of the second reset transistor T7).

For example, the gate electrode G6 of the first reset transistor T6 and the first reset signal line RST1 are connected and formed integrally, and the second gate electrode G32 of the threshold compensation transistor T3 and the gate electrode G2 of the data writing transistor T2 are connected to and formed integrally with the gate line GL, and the gate electrode G4 of the second light-emitting control transistor T4 and the gate electrode G5 of the first light-emitting control transistor T5 are connected to and formed integrally with the light-emitting control signal line EM, and the gate electrode of the second reset transistor T7 is connected to and formed integrally with the second reset signal line.

For example, the display substrate further includes the gate line GL extending along the second direction Y1, a light-emitting control signal line EM, a first reset signal line RST1, and a second reset signal line RST2, for example, the gate electrode of the first reset transistor T6 is connected to and formed integrally with the first reset signal line RST1, and the second gate electrode G32 of the threshold compensation transistor T3 and the gate electrode G2 of the data writing transistor T2 are connected to and formed integrally with the gate line GL. The gate electrode G5 of the first light-emitting control transistor T5 and the gate electrode G4 of the second light-emitting control transistor T4 are connected to and are integrally formed with the light-emitting control signal line EM, and the gate electrode G7 of the second reset transistor T7 and the second reset signal line RST2 are connected and are formed integrally.

For example, the display substrate further includes the data line DATA, the data line DATA is connected to the active layer A4 of the data writing transistor T4, and is configured to provide a data signal DATA, an orthographic projection of the first power line ELVDD1 on the base substrate 100 at least partially overlaps with an orthographic projection of the active layer A6 of the first reset transistor T6 and an orthographic projection of the active layer A1 of the driving transistor T1 on the base substrate 100, the orthographic projection of the data line DATA on the base substrate 100 is located on the side of the orthographic projection of the second semiconductor layer on the base substrate 100 away from the orthographic projection of the first power line ELVDD1 on the base substrate 100.

For example, as shown in FIG. 5D, the pixel driving unit further includes a first transfer electrode EC1, the first transfer electrode EC1 is connected to the active layer A7 of the second reset transistor T7 and the second reset signal line RST2 through a hole, and an orthographic projection of the first transfer electrode EC1 on the base substrate 100 is located between an orthographic projection of the active layer A7 of the second reset transistor T7 and an orthographic projection of the active layer A1 of the driving transistor T1 on the base substrate 100.

For example, referring to FIG. 3, the gate line GL is configured to provide the scan signal SCAN to the pixel circuit 10. The light-emitting control signal line EM is configured to provide the light-emitting control signal EM to the sub-pixel P0. The data line DATA is configured to provide a data signal DATA to the pixel circuit 10, the first power line ELVDD1 is configured to provide a constant first power voltage ELVDD1 to the pixel circuit 10, the second power line ELVSS is configured to provide the pixel circuit 10 with a constant second power voltage ELVSS, and the first power voltage ELVDD1 is greater than the second power voltage ELVSS. The initialization signal line Vinit is configured to provide the initialization signal Vinit to the pixel circuit 10. The initialization signal Vinit is a constant voltage signal, and a magnitude of the initialization signal Vinit can be, for example, between the first power voltage ELVDD1 and the second power voltage ELVSS, however, the present disclosure is not limited thereto, for example, the initialization signal Vinit may be less than or equal to the second power voltage ELVSS. For example, the pixel circuit outputs a driving current to drive the light-emitting element 20 to emit light under the control of the scan signal SCAN, the data signal DATA, the initialization signal Vinit, the first power voltage ELVDD1, the second power voltage ELVSS, and the light-emitting control signal EM. The light-emitting element 20 emits red light, green light, blue light, or white light, etc. under the driving of its corresponding pixel circuit 10.

It should be noted that DATA represents both the data line and the data signal, ELVDD1 represents the first power line and also the first power voltage, ELVDD2 represents the first power edge line, EM represents the light-emitting control signal line and the light-emitting control signal, RST1 represents the first reset signal line and also represents the first reset signal, RST2 represents both the second reset signal line and the second reset signal, Vinit represents both the initialization signal line and the initialization signal, and ELVSS represents both the second voltage signal line and the second voltage signal.

As shown in FIG. 3, the driving transistor T1 of the pixel driving unit P0 is electrically connected to the light-emitting element 20, and outputs the driving current to drive the light-emitting element 20 to emit light under the control of the scan signal SCAN, the data signal DATA, the first power voltage ELVDD1, the second power voltage ELVSS, and other signals.

For example, the display panel provided by the embodiments of the present disclosure further includes: a data driving circuit and a scan driving circuit. The data driving circuit is configured to provide the data signal DATA to the pixel driving unit P0 according to an instruction of the control circuit; the scan driving circuit is configured to provide the pixel driving unit P0 with the light-emitting control signal EM, the scan signal SCAN, the first reset control signal RST1, the second reset signal RST2, and other signals according to the instruction of the control circuit. For example, the control circuit includes an external integrated circuit (IC), but the present disclosure is not limited thereto. For example, the scan driving circuit is a GOA (Gate Driver On Array) structure mounted on the display panel, or a drive chip (IC) structure that is bonded to the display panel. For example, different driving circuits may also be used to respectively provide the light-emitting control signal EM and the scan signal SCAN. For example, the display panel further includes a power source (not shown in the figure) to provide the above-mentioned voltage signal, which can be a voltage source or a current source as required, the power source is configured to supply the first power voltage ELVDD1, the second power voltage ELVSS, the initialization signal Vinit, etc. to the sub-pixel P0 through the first power line ELVDD1, the second power line ELVSS, and the initialization signal line Vinit, respectively.

As shown in FIG. 4, the second electrode C12 of the storage capacitor C1 is electrically connected to the first power line ELVDD1, and the first electrode C11 of the storage capacitor C1 is electrically connected to the second electrode T32 of the threshold compensation transistor T3. The gate electrode T20 of the data writing transistor T2 is electrically connected to the gate line GL, and the first electrode T21 and the second electrode T22 of the data writing transistor T2 are electrically connected to the data line DATA and the first electrode T11 of the driving transistor T1, respectively. The gate electrode T30 of the threshold compensation transistor T3 is electrically connected to the gate line GL, the first electrode T31 of the threshold compensation transistor T3 is electrically connected to the second electrode T12 of the driving transistor T1, and the second electrode T32 of the threshold compensation transistor T3 is electrically connected to the gate electrode T10 of the driving transistor T1.

For example, as shown in FIG. 4, the gate electrode T40 of the second light-emitting control transistor T4 and the gate electrode T50 of the first light-emitting control transistor T5 are both connected to the light-emitting control signal line EM.

For example, as shown in FIG. 4, the first electrode T41 and the second electrode T42 of the second light-emitting control transistor T4 are electrically connected to the first power line ELVDD1 and the first electrode T11 of the driving transistor T1, respectively. The first electrode T51 and the second electrode T52 of the first light-emitting control transistor T5 are respectively electrically connected to the second electrode T12 of the driving transistor T16 and the pixel electrode E1 (which can be the anode of the OLED) of the light-emitting element 20. The common electrode E2 (which may be a common electrode of the OLED, such as a cathode) of the light-emitting element 20 is electrically connected to the second power line ELVSS.

For example, as shown in FIG. 3, the gate electrode T60 of the first reset transistor T6 is electrically connected to the first reset signal line RST1, the first electrode T61 of the first reset transistor T6 is electrically connected to the initialization signal line Vinit (the first initialization signal line 211), and the second electrode T62 of the first reset transistor T6 is electrically connected to the gate electrode T10 of the driving transistor T1. The gate electrode T70 of the second reset transistor T7 is electrically connected to the second reset signal line RST2, the first electrode T71 of the second reset transistor T7 is electrically connected to the initialization signal line Vinit (the second initialization signal line 212), and the second electrode T72 of the second reset transistor T7 is electrically connected to the pixel electrode E1 of the light-emitting element 20.

FIG. 5A shows a semiconductor pattern SCP, and FIG. 5B shows a first conductive layer LY1, and a first insulation layer G11 is provided between the first conductive layer LY1 and the semiconductor pattern SCP. The semiconductor pattern SCP is doped with the first conductive layer LY1 as a mask, so that the region of the semiconductor pattern SCP not covered by the first conductive layer LY1 retains semiconductor characteristics, thereby forming the channel of the thin film transistor, on the other hand, the region of the semiconductor pattern SCP covered by the first conductive layer LY1 is conductive, thereby forming the source electrode or drain electrode of the thin film transistor. FIG. 5A shows an active layer formed after the semiconductor pattern SCP is partially conductorized.

As shown in FIG. 5B, the first conductive layer LY1 includes the first reset signal line RST1, the second reset signal line (not shown in the figure), the light-emitting control signal line EM, the gate line GL and the first electrode C11 of the storage capacitor C1.

FIG. 5C shows the second conductive layer LY2, and the second insulation layer is disposed between the second conductive layer LY2 and the first conductive layer LY1. The second conductive layer LY2 includes the initialization signal line Vinit and the second electrode C12 of the storage capacitor C1. The second electrode C12 of the storage capacitor C1 has an opening. The interlayer insulation layer is located between the second conductive layer LY2 and the third conductive layer LY3. For the first gate insulation layer, the second gate insulation layer, the interlayer insulation layer, the first conductive layer LY1, the second conductive layer LY2, and the third conductive layer LY3, reference may be made to the introduction in the art, and details are not repeated here.

FIG. 5D shows the third conductive layer LY3, and the third conductive layer LY3 includes the first power line ELVDD1, the data line DATA, the first connection electrode EC1, the second connection electrode EC2, and the first electrode E1 of the light-emitting element 20.

It should be noted that, transistors used in some embodiments of the present disclosure may be thin film transistors, field effect transistors, or other switching devices with the same characteristics. A source electrode and a drain electrode of the transistor used herein may be symmetrical in structure, so the source electrode and the drain electrode of the transistor may have no difference in structure. In some embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present disclosure may be the source electrode, and the second electrode may be the drain electrode; alternatively, the first electrode of the transistor may be the drain electrode, and the second electrode may be the source electrode.

In addition, the transistors may be classified into N-type transistors and P-type transistors according to the characteristics of the transistors. The embodiments of the present disclosure are described by taking a case that the transistors are P-type transistors as an example. Based on the description and teaching of the implementation in the present disclosure, those of ordinary skill in the art can easily think of, under the premise of no creative work, an implementation manner of using N-type transistors for at least some of the transistors in the pixel circuit of the embodiments of the present disclosure, that is, an implementation manner of using N-type transistors or a combination of N-type transistors and P-type transistors, and therefore, these implementations are also within the protection scope of the present disclosure.

FIG. 5A takes the pixel circuit of 7T1C as an example for illustration, and embodiments of the present disclosure include but are not limited to this. It should be noted, the embodiments of the present disclosure do not limit the number of thin film transistors and the number of capacitors included in the pixel circuit. For example, in other embodiments, the pixel circuit of the display panel may also have a structure including other numbers of transistors, such as a 7T2C structure, a 6T1C structure, a 6T2C structure, or a 9T3C structure, and the embodiments of the present disclosure do not limit this.

For example, the base substrate 100 in at least one embodiment of the present disclosure may be a glass plate, a quartz plate, a metal plate, a resin-based plate, or the like. For example, the material of the base substrate may include an organic material, for example, the organic material can be a resin material such as polyimide, polycarbonate, polyacrylate, polyetherimide, polyethersulfone, polyethylene terephthalate, and polyethylene naphthalate; for example, the base substrate 100 may be a flexible substrate or a non-flexible substrate, the embodiments of the present disclosure do not limit this.

For example, the materials of the first insulation layer, the second insulation layer, the third insulation layer, and the fourth insulation layer may include inorganic insulation materials such as SiNx, SiOx, SiNxOy, etc., organic insulation materials such as organic resins, or other suitable materials, and the embodiments of the present disclosure do not limit this.

For example, the material of the above third conductive layer LY3 may include titanium, titanium alloy, aluminum, aluminum alloy, copper, copper alloy, or any other suitable composite material, and the embodiments of the present disclosure do not limit this. For example, the materials of the first conductive layer LY1 and the second conductive layer LY2 may be the same as the material of the third conductive layer LY3, and will not be repeated here.

For example, the material of the semiconductor layer SCP may include oxide semiconductor, organic semiconductor, or amorphous silicon, polysilicon, etc., for example, the oxide semiconductor includes a metal oxide semiconductor (e.g., indium gallium zinc oxide (IGZO)), and the polysilicon includes low temperature polysilicon or high temperature polysilicon, etc., which is not limited in the embodiments of the present disclosure. It should be noted that, the above-mentioned source region and drain region may be regions doped with n-type impurities or p-type impurities, and the embodiments of the present disclosure are not limited thereto.

For example, as shown in FIG. 3, the display substrate 10 further includes the peripheral region 102 at least partially surrounding the display region 101, a plurality of first power lines ELVDD1 located in the display region 101, and a first power line edge line ELVDD2 located in the peripheral region 102. For example, the first power line edge line ELVDD2 is disposed around the display region to provide the first power voltage to the first power line ELVDD1 located in the display region.

For example, the plurality of first power lines ELVDD1 extend along the first direction and are configured to be connected to respective columns of pixel driving units in the plurality of pixel driving units, so as to provide the first power voltage to the respective column of pixel driving units, respectively; the first power line edge line ELVDD2 is configured to be connected to the plurality of first power lines ELVDD1 to provide the first power voltage to the first power lines ELVDD1; the voltage signal includes the first power voltage.

Figure 2C:
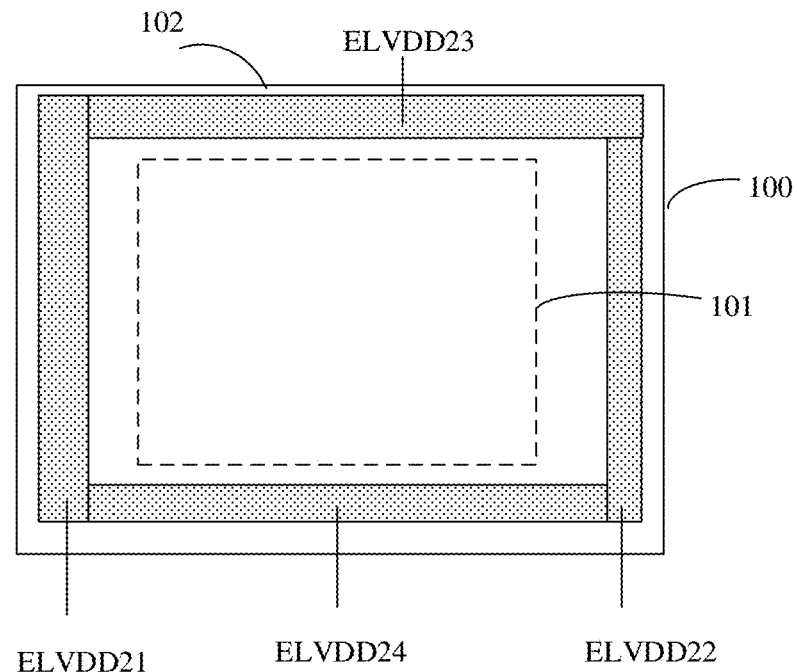
FIG. 2C is a schematic plan view of a display substrate according to at least one embodiment of the present disclosure.

For example, the plurality of light shielding patterns SP include a plurality of first light shielding patterns SP11. For example, as shown in FIG. 2C, the first power line edge line ELVDD2 includes a first sub-conducting line ELVDD21 and a second sub-conducting line ELVDD22 extending in the first direction and oppositely disposed, and a third sub-conducting line ELVDD23 and a fourth sub-conducting line ELVDD24 extending in the second direction and disposed oppositely.

For example, the first sub-conducting line ELVDD21 is disposed on one side of the first column pixel driving unit close to the plurality of pixel driving units.

For example, the first ends sp111 of the plurality of first light shielding patterns sp11 are connected to the first sub-conducting line ELVDD21 to receive the first power voltage, the second ends sp112 of the plurality of first light shielding patterns sp11 at least partially overlap with the intermediate region CP of each pixel driving unit in the first column of pixel driving units in the direction perpendicular to the base substrate 100.

It should be noted that only the first sub-conducting line is shown in the figure, and the embodiments of the present disclosure are not limited thereto.

For example, the extending direction of the first light shielding pattern sp11 is different from the extending direction of the first sub-conducting line ELVDD21.

Figure 6:
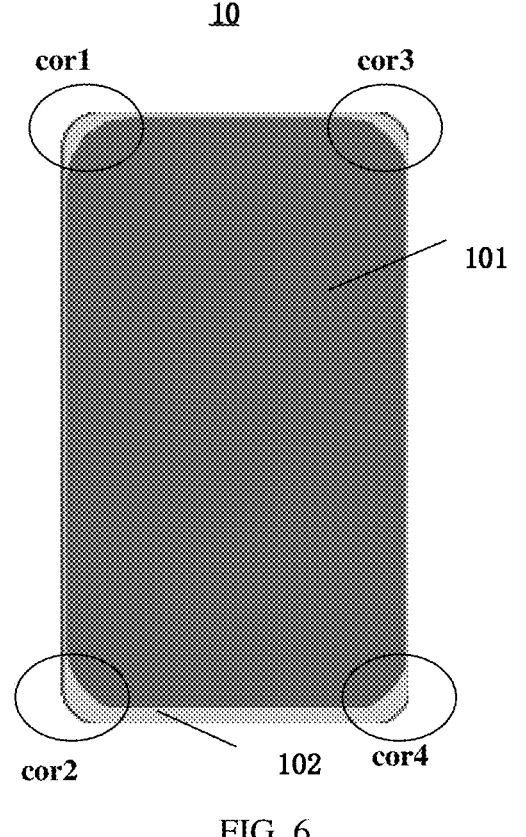
FIG. 6 is a schematic plan view of another display substrate provided by some embodiments of the present disclosure.

FIG. 6 is a schematic plan view of another display substrate provided by some embodiments of the present disclosure. As shown in FIG. 6, the display substrate 10 has a display region 101 and a peripheral region 102 at least partially surrounding (e.g., completely surrounding) the display region 101. For example, the shape of the display region 101 of the display substrate 10 may be a rectangle with rounded corners, and the peripheral region 102 surrounds the display region 101 and has the same outline as the display region 101, so that the display substrate 10 has a rectangular shape with rounded corners. The following description will be given by taking the display substrate 10 as an example, but the embodiments of the present disclosure are not limited thereto.

As shown in FIG. 6, the display substrate 10 includes a first corner region cor1, a second corner region cor2, a third corner region cor3, and a fourth corner region cor4. For example, the first corner region cor1 and the second corner region cor2 are disposed on one side of the display substrate 10 (e.g., the left side of the display substrate shown in FIG. 6); the third corner region cor3 and the fourth corner region cor4 are disposed on the other side of the display substrate (e.g., the right side of the display substrate shown in FIG. 6). For example, the compensation capacitors are located in any two corner regions, in different columns, among the first corner region cor1, the second corner region cor2, the third corner region cor3, and the fourth corner region cor4, for example, in the first corner region cor1 and the fourth corner region cor4. For example, the function of the compensation capacitor will be described in detail below.

Figure 7:
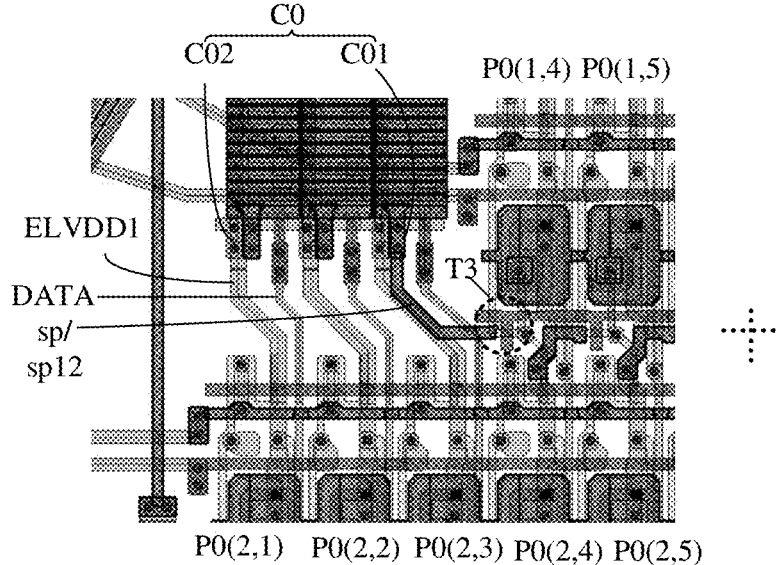
FIG. 7 is a schematic diagram of a stacked structure of a first corner region cor1 shown in FIG. 6.
Figure 8B:
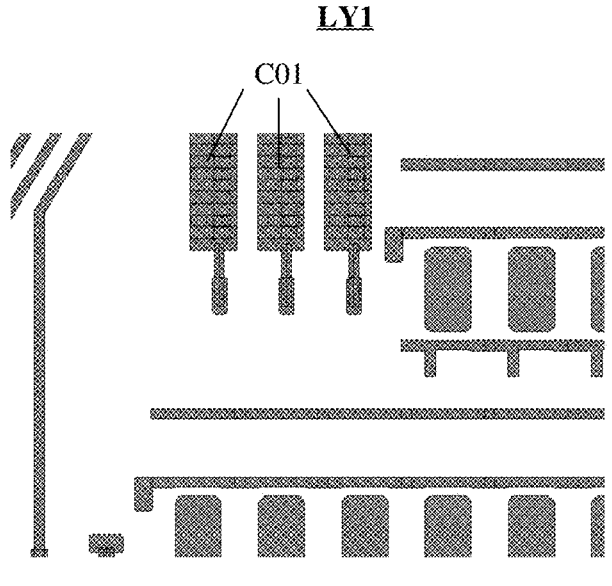
FIG. 8B is a plan view of a first conductive layer of the display substrate shown in FIG. 7.
Figure 8C:
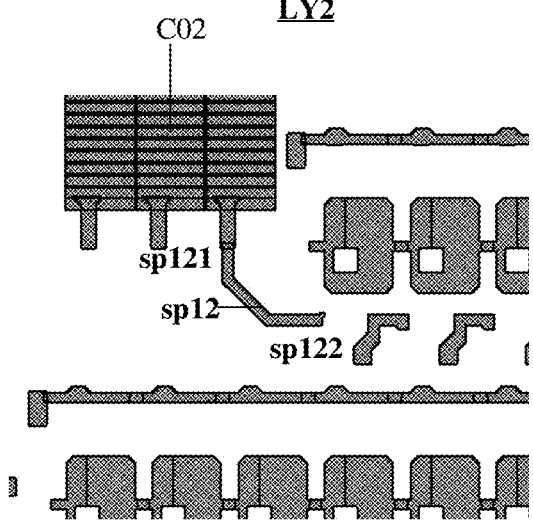
FIG. 8C is a plan view of a second conductive layer of the display substrate shown in FIG. 7.
Figure 8D:
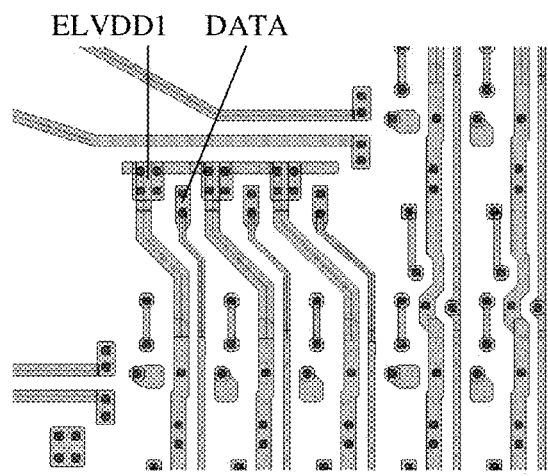
FIG. 8D is a plan view of a third conductive layer of the display substrate shown in FIG. 7.

FIG. 7 is a schematic diagram of a stacked structure of a first corner region cor1 shown in FIG. 6; FIG. 8A is a plan view of a semiconductor pattern of the display substrate shown in FIG. 7; FIG. 8B is a plan view of a first conductive layer of the display substrate shown in FIG. 7; FIG. 8C is a plan view of a second conductive layer of the display substrate shown in FIG. 7; FIG. 8D is a plan view of a third conductive layer of the display substrate shown in FIG. 7. The display substrate 10 according to the embodiment of the present disclosure will be described in detail below with reference to FIGS. 7 to 8D.

For example, the display substrate 10 further includes: a plurality of signal lines (for example, the plurality of first power lines ELVDD1, the first power line edge line ELVDD2, the data line DATA, the initialization signal line Vinit, the light-emitting control signal line EM, the gate line GL, and the first reset signal line RST1 described above) respectively electrically connected to the plurality of pixel driving units, a first electrode pattern C01 located in the peripheral region and electrically connected to at least one of the plurality of signal lines, and a second electrode pattern C02 located in the peripheral region.

For example, in the embodiments of the present disclosure, the signal line is the gate line GL or the data line DATA. It should be noted that, in FIGS. 7 to 8D, the present disclosure is described by taking a case that the signal line is the data line DATA as an example, and the embodiments of the present disclosure do not limit this.

For example, the first electrode pattern C01 and the second electrode pattern C02 are located on a side of the peripheral region close to the outermost first column pixel driving unit of at least one row of pixel driving units. The first electrode pattern C01 and the second electrode pattern C02 at least partially overlap in the direction perpendicular to the board surface of the base substrate 100 and are insulated with each other, so as to form a compensation capacitor C0. Therefore, the transmission load (for example, the transmission load on the signal line may refer to the transmission resistor of the signal line, or the capacitor formed between the signal line and other lines) on the signal line electrically connected to the first electrode pattern C01 can be compensated by the capacitor formed between the first electrode pattern C01 and the second electrode pattern C02, so as to improve the consistency of the transmission loads on the plurality of signal lines in the display region 101. In this way, the signal transmission effect of the plurality of signal lines in the display region 101 can be improved, so that the brightness uniformity and consistency of the provided display screen can be improved, thereby reducing or avoiding display abnormality or poor phenomenon on the display screen and ameliorating the display effect of the screen.

For example, as shown in FIG. 7 and FIG. 8D, in the case where the signal line is the data line DATA, the transmission load on the data line DATA electrically connected to the first electrode pattern C01 is compensated by the compensation capacitor formed between the first electrode pattern C01 and the second electrode pattern 02, thereby ameliorating the transmission effect of, for example, the data signal transmitted on the data line DATA, and improving the consistency of the transmission effect of data signals on a plurality of data lines in the display region 101.

For example, the first electrode pattern C01 is located in the first conductive layer LY1, and the second electrode pattern C02 is located in the second conductive layer LY2. For example, the first electrode pattern C01 is connected to a signal line (i.e., the data line DATA) through a hole to receive the data signal; the second electrode pattern C02 is connected to the first power line ELVDD1 through a hole to receive the first power voltage, thereby forming a compensation capacitor between the first electrode pattern C01 and the second electrode pattern C02 to compensate the load capacitance of the signal line. The second electrode pattern C02 is connected to the first power line ELVDD1 through a hole to receive the first power voltage, so that the second electrode pattern C02 can have a stable voltage, thereby improving the stability of the compensation capacitor formed between the first electrode pattern C01 and the second electrode pattern C02, and the first voltage signal further weakens or avoids the interference of other structures or devices, located on the side of the second electrode pattern C02 away from the base substrate 100, of the display substrate 10 to the electrical signal transmitted on the first electrode pattern C01. For example, the first power voltage may be a high-level voltage signal or a low-level voltage signal, the embodiments of the present disclosure are not limited thereto.

For example, the light shielding pattern sp further includes: at least one second light shielding pattern sp12. For example, as shown in FIGS. 8A and 8C, the first end sp121 of the at least one second light shielding pattern sp12 and the second electrode pattern C02 are connected and formed integrally, the second end sp122 of the at least one second light shielding pattern sp12 and the intermediate region CP of the threshold compensation transistor T3 of the first column pixel driving unit (for example, the pixel drive unit P0 (1, 4) located in the first row and first column) of at least one row of pixel driving units adjacent to the second electrode pattern C02 in the second direction X1 at least partially overlap in the direction perpendicular to the board surface of the base substrate 100, so that the "small pepper" design structure can be introduced into in the first column of pixel driving units at the outermost side of the display region, so as to reduce the leakage capability of the double-gate transistor T3 and avoid dark lines on the left border of the screen, thereby improving the uniformity of the brightness of the display screen and improving the display quality of the display panel.

For example, the number of pixels of at least one row of pixel driving units (For example, as shown in FIG. 6, the pixel driving unit P0(1) located in the first row) adjacent to the first electrode pattern C01 or the second electrode pattern C02 in the second direction X1 is smaller than the number of pixels of a row of pixel driving units (For example, as shown in FIG. 6, the pixel driving unit P0(2) located in the second row) adjacent to the first electrode pattern C01 or the second electrode pattern C02 in the first direction Y1.

For example, as shown in FIGS. 7, 8A, and 8B, a plurality of first electrode patterns C01 are arranged at intervals. For example, in a direction parallel to the board surface of the base substrate 100, the peripheral region 102 further includes a spacer pattern 190 located between two adjacent first electrode patterns C01 and insulated from the first electrode patterns C01 from each other, the spacer pattern 190 can reduce or avoid signal interference between adjacent first electrode patterns C01, thereby improving the stability of the electrical signals transmitted on the first electrode patterns C01.

For example, in some embodiments of the present disclosure, the spacer pattern 190 may be electrically connected with the second electrode pattern C02 to receive the first power voltage from the first power line ELVDD1, therefore, on the basis that the spacer pattern 190 and the first electrode pattern C01 adjacent to the spacer pattern 190 form a capacitor in a plane parallel to the board surface of the base substrate 100, the layout structure in the peripheral region 102 of the display substrate 10 can be further optimized, thereby helping the display substrate 10 to achieve a narrow frame design.

For example, in other embodiments of the present disclosure, the spacer pattern 190 may be configured to receive a second power voltage from a second power line different from the first power line, in this way, the spacer pattern 190 and the first electrode pattern C01 adjacent to the spacer pattern 190 can form a capacitor in the plane parallel to the board surface of the base substrate 100, thereby further improving the compensation effect of the transmission load on the data line DATA electrically connected to the first electrode pattern C01 and further improving the stability and consistency of the signal transmission effect of the plurality of data lines DATA in the display region 101.

For example, the orthographic projection of the data line DATA on the base substrate at least partially overlaps the orthographic projection of the storage capacitor C1 on the base substrate.

For example, as shown in FIG. 8A, the spacer pattern 190 is located in the semiconductor pattern SCP, and may be connected to the second electrode pattern C02 through a hole of a hole structure penetrating at least the first insulation layer, the second insulation layer, and the third insulation layer, and the embodiments of the present disclosure do not limit this. Therefore, by forming the spacer pattern 190 and the active layer of the thin film transistor in the same layer in the manufacturing process (for example, forming by using the same material layer through a patterning process), the manufacturing process of the display substrate 10 can be further simplified, and the manufacturing cost of the display substrate 10 can be reduced, thereby facilitating mass production and application of the display substrate 10.

For example, in the embodiments of the present disclosure, the spacer pattern 19 extends along the first direction Y1 and is in the shape of an elongated strip; while in other embodiments of the present disclosure, the spacer pattern 190 can also extend in a curve shape contour, a zigzag line shape contour, or other suitable contours, and the shape of the spacer pattern 190 can also adopt, for example, an ellipse, a square, a sawtooth shape, or other suitable regular or irregular shapes according to actual needs, and the embodiments of the present disclosure do not limit this.

For example, in some embodiments of the present disclosure, because the peripheral region 102 provided with the spacer pattern 190 at least partially surrounds the display region 101 and is disposed along the edge of the display region 101, therefore, by arranging the spacer pattern 190 in the same layer as the active layer of the thin film transistor, excessive etching of the active layer near the edge portion of the display region 101 during the manufacturing process of the display substrate 10 can be reduced or avoided, thereby ameliorating the etching uniformity of the boundary position of the display region 101 and achieving a better etching effect.

It should be noted that, for the sake of clarity and conciseness, the parts in FIGS. 7-8D similar to those in FIGS. 3-6 are no longer shown, and the structure of the pixel driving unit P0 may refer to the description of FIGS. 5A-5D, and details are not repeated here. The following embodiments are the same as those described herein and will not be repeated.

It should also be noted that, for the sake of clarity and conciseness, FIG. 7 only shows some pixel driving units P0(1, 4)-P0(2, 5) located in the first row and the second row, the display substrate 10 may further include more pixel driving units P0, and the embodiments of the present disclosure are not limited in this aspect. The following embodiments are the same as those described herein and will not be repeated.

Figure 9:
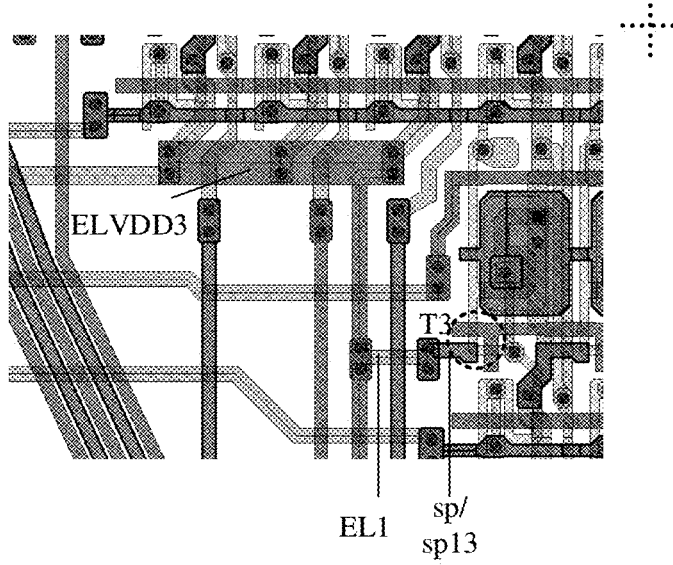
FIG. 9 is a schematic diagram of a stacked structure of a second corner region cor2 shown in FIG. 6.
Figure 10A:
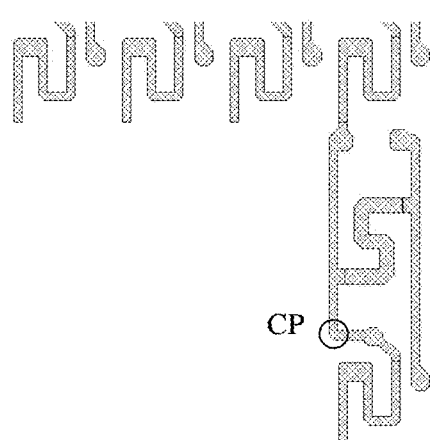
FIG. 10A is a plan view of a semiconductor pattern of the display substrate shown in FIG. 9.
Figure 10B:
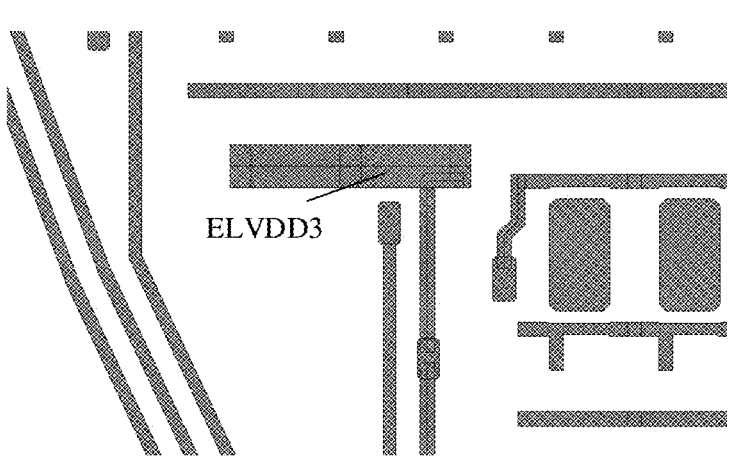
FIG. 10B is a plan view of a first conductive layer of the display substrate shown in FIG. 9.
Figure 10C:
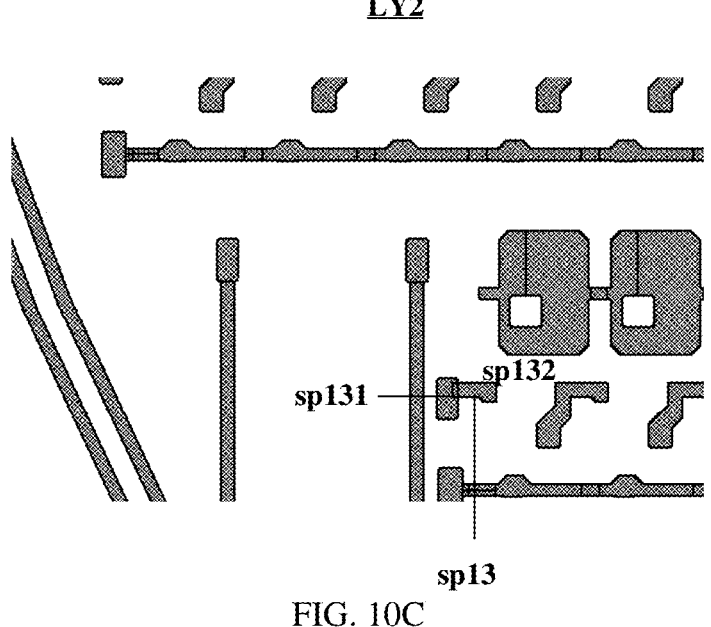
FIG. 10C is a plan view of a second conductive layer of the display substrate shown in FIG. 9.
Figure 10D:
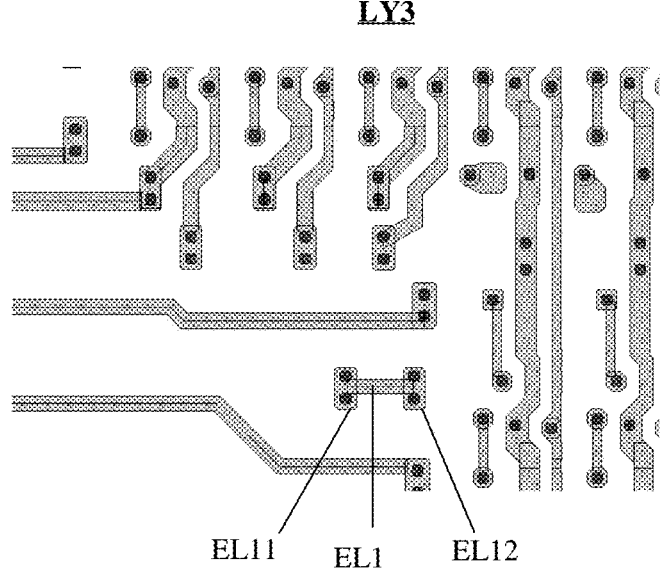
FIG. 10D is a plan view of a third conductive layer of the display substrate shown in FIG. 9.

FIG. 9 is a schematic diagram of a stacked structure of a second corner region cor2 shown in FIG. 6; FIG. 10A is a plan view of a semiconductor pattern of the display substrate shown in FIG. 9; FIG. 10B is a plan view of a first conductive layer of the display substrate shown in FIG. 9; FIG. 10C is a plan view of a second conductive layer of the display substrate shown in FIG. 9; and FIG. 10D is a plan view of a third conductive layer of the display substrate shown in FIG. 9. The display substrate 10 according to another embodiment of the present disclosure will be described in detail below with reference to FIGS. 9 to 10D.

For example, as shown in FIG. 9, the display substrate 10 further includes a power connection line ELVDD3 located on a side of the peripheral region 102 close to the outermost first column pixel driving unit of at least one row of pixel driving units. For example, the power connection line ELVDD3 is located in the first conductive layer LY1, and is connected to the first power line ELVDD1 and the first power line edge line ELVDD2 located at the periphery through holes penetrating through the second insulation layer and the third insulation layer to receive first power voltage.

For example, as shown in FIG. 9 and FIG. 10C, the light shielding pattern sp further includes at least one third light shielding pattern sp13 located in the second conductive layer LY2. For example, a first end sp131 of the at least one third light shielding pattern sp13 is connected to the power connection line ELVDD3, for example, connected to the power connection line ELVDD3 through a hole penetrating through the third insulation layer; a second end sp132 of the at least one third light shielding pattern sp13 at least partially overlaps with an intermediate region CP of a threshold compensation transistor T3 of a first column pixel driving unit of at least one row of pixel driving units adjacent to the power connection line ELVDD3 in the second direction X1 in the direction perpendicular to the base substrate 10, so that a "small pepper" design structure can be introduced into the outermost first column pixel driving unit of the display region to reduce the leakage capability of the double-gate transistor T3 and avoid dark lines on the left border of the screen, thereby improving the uniformity of the brightness of the display screen and improving the display quality of the display panel.

For example, as shown in FIG. 9, the number of pixels in at least one row of pixel driving units (for example, as shown in FIG. 9, at least one row of pixel driving units located on the left side of the second corner region cor2) adjacent to the power connection line ELVDD3 in the second direction X1 is smaller than the number of pixels of a row of pixel driving units (For example, as shown in FIG. 9, each row of pixel driving units located on the upper side of the second corner region cor2) adjacent to the power connection line ELVDD3 in the first direction Y1.

For example, as shown in FIG. 9 and FIG. 10D, the display substrate further includes: a first transfer electrode EL1 located in the third conductive layer LY3, for example, a first end EL11 of the first transfer electrode EL1 is connected to the power connection line ELVDD3 through a hole penetrating through the second insulation layer and the third insulation layer, and a second end EL12 of the first transfer electrode EL1 is connected to the at least one third light shielding pattern sp13 through a hole penetrating through the third insulation layer.

For example, in the display substrate shown in FIG. 6, the intermediate region CP of the threshold compensation transistor T3 in the outermost first column pixel driving unit of at least one row of pixel driving units on the left side of the first corner region cor1 of the display substrate 10 is shielded by the second end sp122 of the second light shielding pattern sp12 connected to the second electrode pattern C02 of the compensation capacitor in the first corner region cor1; the intermediate region CP of the threshold compensation transistor T3 in the outermost first column pixel driving unit of at least one row of pixel driving units on the left side of the second corner region cor2 of the display substrate 10 is shielded by the second end sp132 of the third light shielding pattern sp13 connected to the power connection line ELVDD3 in the second corner region cor2; the intermediate region CP of the threshold compensation transistor T3 in the outermost first column pixel driving unit of at least one row of pixel driving units between the first corner region cor1 and the second corner region of the display substrate 10 is shielded by the second end sp112 of the first light shielding pattern sp11 connected to the first power line edge line ELVDD2 in the peripheral region 102, so that, it is possible to introduce a "small pepper" design structure into the outermost first column pixel driving unit of the display region, so as to reduce the leakage capability of the double-gate transistor T3 and avoid dark lines on the left border of the screen, thereby improving the uniformity of the brightness of the display screen and improving the display quality of the display panel.

Figure 11:
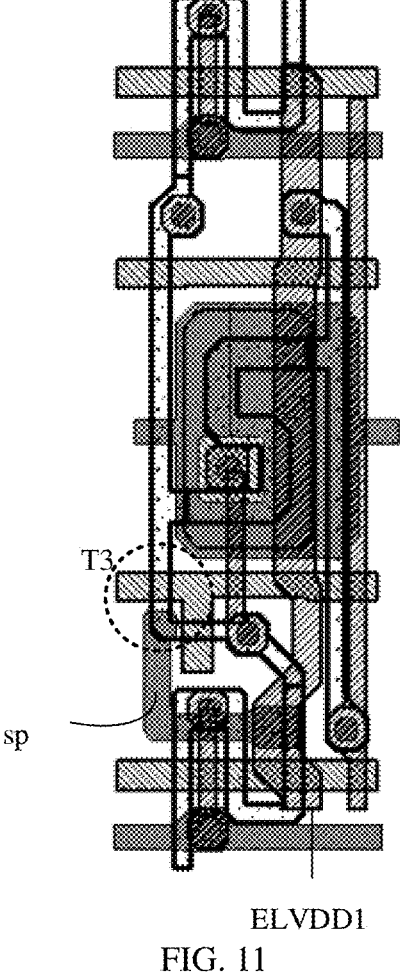
FIG. 11 is a schematic diagram of a pixel driving unit according to some embodiments of the present disclosure.
Figure 12A:
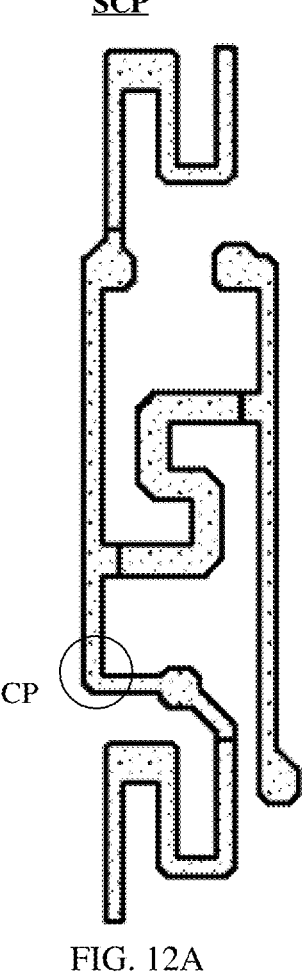
FIG. 12A is a plan view of a semiconductor pattern of the display substrate shown in FIG. 11.
Figure 12B:
FIG. 12B is a plan view of a first conductive layer of the display substrate shown in FIG. 11.
Figure 12B:
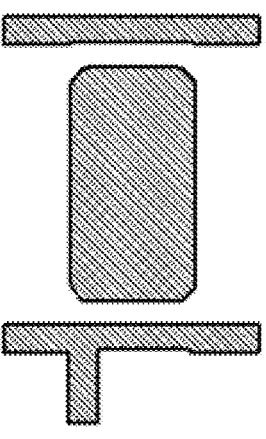
Figure 12B:
Figure 12C:
FIG. 12C is a plan view of a second conductive layer of the display substrate shown in FIG. 11.
Figure 12C:
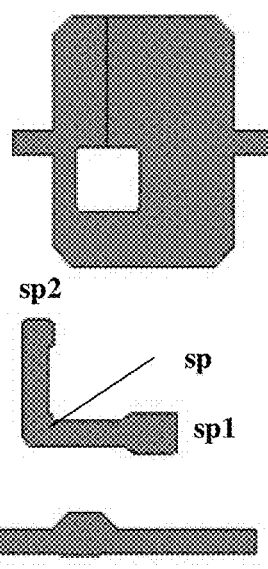
Figure 12D:
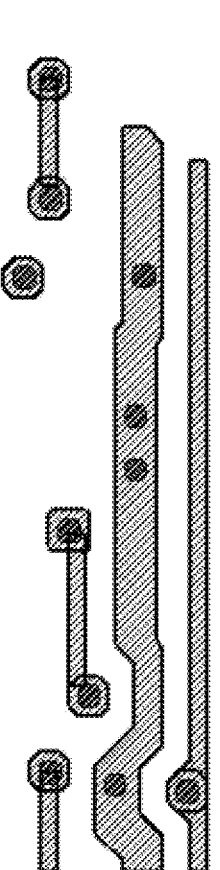
FIG. 12D is a plan view of a third conductive layer of the display substrate shown in FIG. 11.

FIG. 11 is a schematic diagram of a pixel driving unit according to at least one embodiment of the present disclosure; FIG. 12A is a plan view of a semiconductor pattern of the display substrate shown in FIG. 11; FIG. 12B is a plan view of a first conductive layer of the display substrate shown in FIG. 11; FIG. 12C is a plan view of a second conductive layer of the display substrate shown in FIG. 11; and FIG. 12D is a plan view of a third conductive layer of the display substrate shown in FIG. 11. The display substrate 10 according to an embodiment of the present disclosure will be described in detail below with reference to FIGS. 11 to 12D.

For example, as shown in FIG. 11 to FIG. 12D, the first ends sp1 of at least one light shielding pattern in the plurality of light shielding patterns sp is respectively connected with the first power line ELVDD1 corresponding to the outermost first column pixel driving unit of at least one row of pixel driving units to receive the first power voltage as a voltage signal; the second ends sp2 of the plurality of light shielding patterns sp at least partially overlap the intermediate regions of the threshold compensation transistors T3 of respective pixel driving units in the first column of pixel driving units in the direction perpendicular to the base substrate 100, respectively, so that a "small pepper" design structure can be introduced into the outermost first column pixel driving units of the display region to reduce the leakage capability of the double-gate transistor T3 and avoid dark lines on the left border of the screen, thereby improving the uniformity of the brightness of the display screen and improving the display quality of the display panel.

For example, in the embodiments of the present disclosure, the first power lines are connected to respective columns of pixel driving units, respectively, and the first ends of the light shielding patterns are respectively connected to the first power lines corresponding to the respective columns of pixel driving units, that is, for example, in the display region shown in FIG. 7, the first end of the light shielding pattern corresponding to the pixel driving unit located in the first row and the fourth column (the outermost first column pixel driving unit in the first row) is correspondingly connected to the first power line corresponding to the fourth column of pixel driving units, the first end of the light shielding pattern corresponding to the pixel driving unit located in the second row and the first column is correspondingly connected to the first power line corresponding to the first column of pixel driving units, the first end of the light shielding pattern corresponding to the pixel driving unit located in the third row and the first column is correspondingly connected to the first power line corresponding to the first column of pixel driving units, and so on, that is, the light shielding patterns corresponding to the first column pixel driving units of respective rows of pixel driving units are respectively connected to the first power lines ELVDD1 (located in the display region) corresponding to the first column pixel driving units of the respective rows, so as to avoid the first end of the light shielding pattern from being connected to the first power line edge line ELVDD2, the second electrode pattern C02, or the power connection line ELVDD3 in the peripheral region, thereby simplifying the manufacturing process of the display substrate, which is more beneficial to the implementation of the narrow frame of the display substrate.

It should be noted that, for the sake of clarity and conciseness, FIG. 11 is described by taking the circuit structure of one pixel driving unit as an example, and the circuit structures of more pixel driving units included in the display substrate are similar to that of the pixel driving unit shown in FIG. 11, and details are not repeated here. For the specific introduction of the pixel driving unit, reference may be made to the related descriptions in FIGS. 5A-5D, and details are not repeated here.

Figure 13:
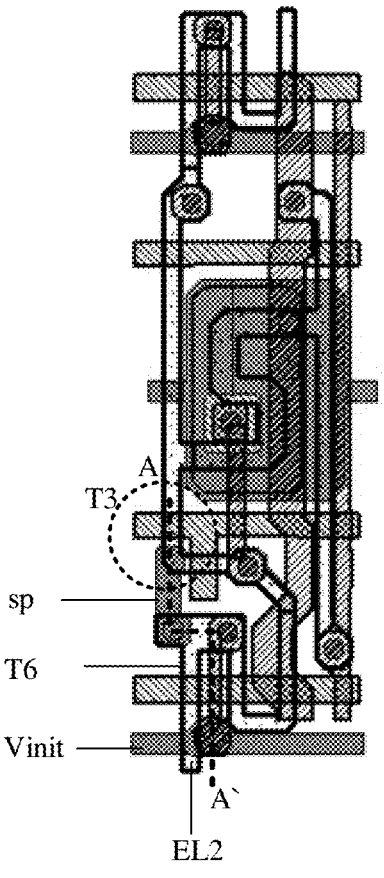
FIG. 13 is a schematic diagram of a pixel driving unit according to some embodiments of the present disclosure.
Figure 14A:
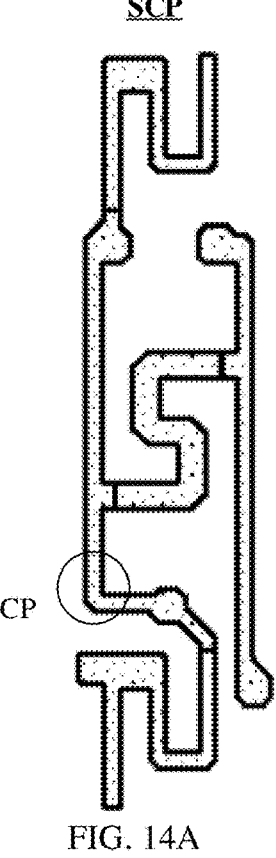
FIG. 14A is a plan view of a semiconductor pattern of the display substrate shown in FIG. 13.
Figure 14B:
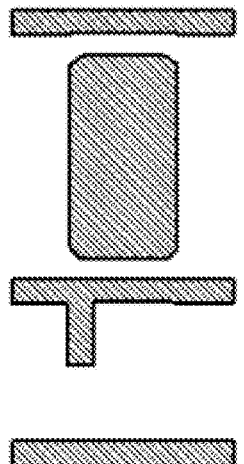
FIG. 14B is a plan view of a first conductive layer of the display substrate shown in FIG. 13.
Figure 14C:
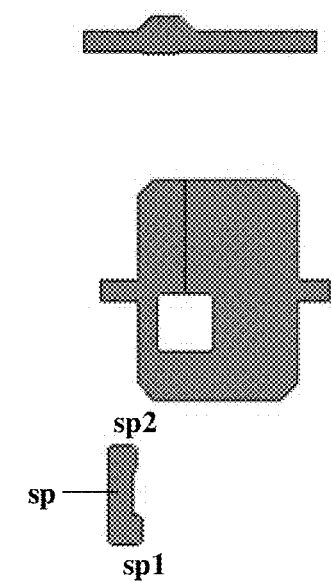
FIG. 14C is a plan view of a second conductive layer of the display substrate shown in FIG. 13.
Figure 14D:
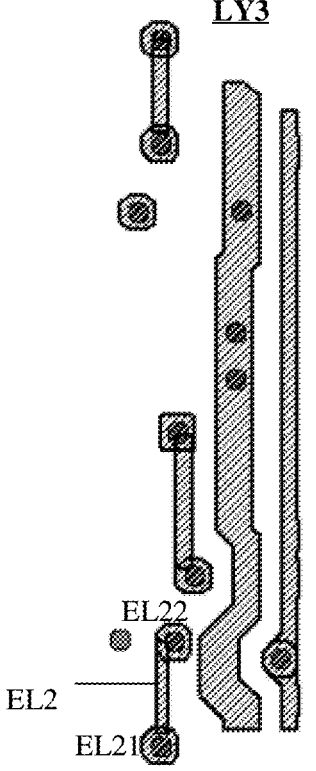
FIG. 14D is a plan view of a third conductive layer of the display substrate shown in FIG. 13.
Figure 15:
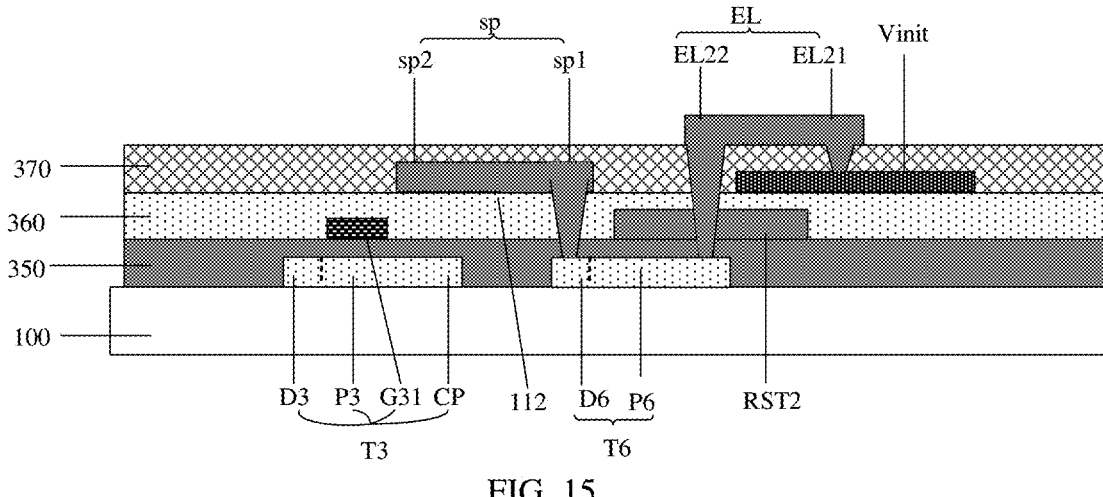
FIG. 15 is a schematic cross-sectional view of the display substrate shown in FIG. 13 along a section line A-A.

FIG. 13 is a schematic diagram of a pixel driving unit according to at least one embodiment of the present disclosure; FIG. 14A is a plan view of a semiconductor pattern of the display substrate shown in FIG. 13; FIG. 14B is a plan view of a first conductive layer of the display substrate shown in FIG. 13; FIG. 14C is a plan view of a second conductive layer of the display substrate shown in FIG. 13; FIG. 14D is a plan view of a third conductive layer of the display substrate shown in FIG. 13; and FIG. 15 is a schematic cross-sectional view of the display substrate shown in FIG. 13 along a section line A-A'. The display substrate 10 according to an embodiment of the present disclosure will be described in detail below with reference to FIGS. 13 to 15.

For example, the display substrate 10 further includes an initialization signal line Vinit configured to provide an initialization signal to the plurality of pixel driving units, for example, the above-mentioned voltage signal includes the initialization signal. It should be noted that the above-mentioned voltage signal may also include other constant voltage signals, and the embodiments of the present disclosure are not limited in this aspect.

For example, as shown in FIG. 4 and FIGS. 5A-5D, each of the plurality of pixel driving units further includes a first reset transistor T6 and a second reset transistor T7; a first electrode of the first reset transistor T6 is connected to the initialization signal line Vinit to receive the initialization signal, a second electrode of the first reset transistor T6 is connected to the threshold compensation transistor T3, and a gate electrode of the first reset transistor T6 is connected to the first reset signal line RST1 to receive the first reset signal; a first electrode of the second reset transistor T7 is connected to the initialization signal line Vinit to receive the initialization signal, a second electrode of the second reset transistor T7 is connected to the first light-emitting control transistor T5 and the light-emitting element 20, and a gate electrode of the second reset transistor T7 is connected to the second reset signal line RST2 to receive the second reset signal.

For example, the active layer of the first reset transistor T6 and the active layer of the driving transistor T1 at least partially overlap with the first power line ELVDD.

For the specific description of the pixel driving unit, reference may be made to the description of FIG. 5A to FIG. 5D, which will not be repeated here.

For example, as shown in FIG. 13-FIG. 15, the display substrate further includes a plurality of second transfer electrodes EL2, a first insulation layer 350, a second insulation layer 360, and a third insulation layer 370, first ends EL21 of the plurality of second transfer electrodes EL2 are respectively connected to the initialization signal line Vinit through holes penetrating through the third insulation layer 370 to receive the initialization signal, second ends EL22 of the plurality of second transfer electrodes EL2 are further connected to the first electrodes D6 of the first reset transistors T6 of respective pixel driving units in the outermost first column of pixel driving units through holes penetrating through the first insulation layer 350, the second insulation layer 360, and the third insulation layer 370, respectively; and the first electrodes D6 of the first reset transistors T6 of respective pixel driving units in the outermost first column of pixel driving units are connected to the first ends sp1 of the plurality of light shielding patterns sp through holes penetrating through the first insulation layer 350 and the second insulation layer 360, respectively.

As shown in FIG. 15, the second ends sp2 of the plurality of light shielding patterns sp at least partially overlap the intermediate regions cp of the threshold compensation transistors T3 of respective pixel driving units in the outermost first column of pixel driving units in the direction perpendicular to the base substrate 100, so that a "small pepper" design structure (i.e., the light shielding pattern sp) can be introduced into the outermost first column pixel driving units of the display region to reduce the leakage capability of the double-gate transistor T3 and avoid dark lines on the left border of the screen, thereby improving the uniformity of the brightness of the display screen and improving the display quality of the display panel.

For example, in the embodiments of the present disclosure, the initialization signal lines Vinit are connected to respective rows of pixel driving units, and the first ends sp1 of the light shielding patterns sp are respectively connected to the initialization signal lines Vinit corresponding to respective rows of pixel driving units, that is, for example, in the display region shown in FIG. 7, the first end of the light shielding pattern corresponding to the pixel driving unit in the first row and the fourth column is correspondingly connected to the initialization signal line Vinit corresponding to the first row of pixel driving units, the first end of the light shielding pattern corresponding to the pixel driving unit in the second row and the first column is correspondingly connected to the initialization signal line Vinit corresponding to the second row of pixel driving units, the first end of the light shielding pattern corresponding to the pixel driving unit in the third row and the first column is connected to the initialization signal line Vinit corresponding to the third row of pixel driving units, and so on, that is, the light shielding patterns corresponding to the first column pixel driving units of respective rows of pixel driving units are respectively connected to the initialization signal lines Vinit (located in the display region) corresponding to the rows of pixel driving units, respectively, so as to avoid the first end of the light shielding pattern from being connected to the first power line edge line ELVDD2, the second electrode pattern C02, or the power connection line ELVDD3 in the peripheral region, thereby simplifying the manufacturing process of the display substrate, which is more conducive to the implementation of a narrow frame of the display substrate.

It should be noted that, for the sake of clarity and conciseness, FIG. 13 is described by taking the circuit structure of one pixel driving unit as an example, and the circuit structures of more pixel driving units included in the display substrate are similar to that of the pixel driving unit shown in FIG. 13, and details are not repeated here. For the specific introduction of the pixel driving unit, reference may be made to the related descriptions in FIGS. 5A-5D, and details are not repeated here.

Figure 16:
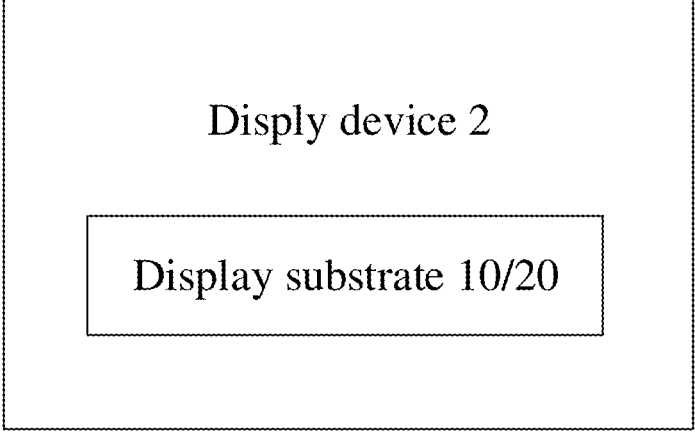
FIG. 16 is a schematic diagram of a display device according to at least one embodiment of the present disclosure.

FIG. 16 is a schematic diagram of a display device according to at least one embodiment of the present disclosure. At least one embodiment of the present disclosure provides a display device 2, and the display device 2 may include the display substrate 10/20 according to any of the above-mentioned embodiments.

For example, as shown in FIG. 16, the display device 2 may further include a flexible circuit board and a control chip. For example, the flexible circuit board is bonded to the bonding region of the display substrate 10, and the control chip is mounted on the flexible circuit board, thereby being electrically connected to the display region; or, the control chip is directly bonded to the bonding region, thereby being electrically connected to the display region.

For example, the control chip may be a central processing unit, a digital signal processor, a system-on-chip (SoC), or the like. For example, the control chip may further include a memory, a power module, etc., and can also implement power supply and signal input and output functions through additionally provided lines, signal lines, and the like. For example, the control chip may also include hardware circuits, computer executable codes, and the like. The hardware circuits may include conventional very large scale integration (VLSI) circuits or gate arrays as well as off-the-shelf semiconductors, such as logic chips, transistors, or other discrete components; and the hardware circuits may also include field programmable gate arrays, programmable array logic, programmable logic devices, and the like.

For example, the display device 2 provided by at least one embodiment of the present disclosure may be any product or component with a display function, such as an OLED panel, an OLED TV, a QLED panel, a QLED TV, a mobile phone, a tablet computer, a notebook computer, a digital photo frame, and a navigator. The display device 2 may further include other components, such as a data driving circuit, a timing controller, etc., and the embodiments of the present disclosure do not limit this.

It should be noted that, for the sake of clarity and conciseness, the embodiments of the present disclosure do not provide all the constituent units of the display device. In order to achieve the substrate function of the display device, those skilled in the art can provide or set other structures not shown according to specific needs, and the embodiments of the present disclosure do not limit this case.

Regarding the technical effect of the display device provided in the above-mentioned embodiments, reference may be made to the technical effect of the display substrate provided in the embodiments of the present disclosure, which will not be repeated here.

The following should be noted:

(1) Only the structures involved in the embodiments of the present disclosure are illustrated in the drawings of the embodiments of the present disclosure, and other structures can refer to usual designs;

(2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:

a base substrate;

a display region, on the base substrate and comprising a plurality of pixel driving units arranged in a plurality of rows and a plurality of columns, wherein each of the plurality of pixel driving units comprises a threshold compensation transistor, a first light-emitting control transistor, and a storage capacitor, and the threshold compensation transistor is connected to the first light-emitting control transistor and the storage capacitor, respectively, the threshold compensation transistor comprises a first gate electrode and a second gate electrode, and an active layer of the threshold compensation transistor comprises a first channel region corresponding to the first gate electrode, a second channel region corresponding to the second gate electrode, and an intermediate region between the first channel region and the second channel region, the first channel region and the second channel region are connected through the intermediate region;

a plurality of light shielding patterns, wherein each light shielding pattern comprises a first end and a second end, first ends of the plurality of light shielding patterns are used for receiving a voltage signal, a second end of at least one light shielding pattern in the plurality of light shielding patterns at least partially overlaps with an intermediate region of a threshold compensation transistor of an outermost first pixel driving unit of at least one row of pixel driving units in a direction perpendicular to the base substrate; and a peripheral region at least partially surrounding the display region, a plurality of first power lines in the display region, and a first power line edge line in the peripheral region, wherein the plurality of first power lines extend along a first direction and are configured to be connected to respective columns of pixel driving units in the plurality of pixel driving units, so as to provide a first power voltage to the respective columns of pixel driving units, respectively;

the first power line edge line is configured to be connected to the plurality of first power lines, so as to provide the first power voltage to the plurality of first power lines;

wherein the voltage signal comprises the first power voltage.

2. The display substrate according to claim 1, wherein the plurality of light shielding patterns comprise a plurality of first light shielding patterns;

the first power line edge line comprises a first sub-conducting line and a second sub-conducting line that extend along the first direction and are arranged oppositely, and a third sub-conducting line and a fourth sub-conducting line that extend along a second direction and are arranged oppositely;

the first sub-conducting line is on a side of the first pixel driving unit close to the plurality of pixel driving units;

first ends of the plurality of first light shielding patterns are connected to the first sub-conducting line to receive the first power voltage, and a second end of at least one first light shielding pattern of the plurality of first light shielding patterns at least partially overlaps with the intermediate region of the threshold compensation transistor of the first pixel driving unit of the at least one row of pixel driving units in the direction perpendicular to the base substrate.

3. The display substrate according to claim 2, wherein an extending direction of the first light shielding pattern is different from an extending direction of the first sub-conducting line.

4. The display substrate according to claim 1, further comprising: a plurality of signal lines respectively electrically connected to the plurality of pixel driving units, a first electrode pattern in the peripheral region and electrically connected to at least one signal line of the plurality of signal lines, and a second electrode pattern in the peripheral region, wherein the first electrode pattern and the second electrode pattern are on a side of the peripheral region close to the outermost first pixel driving unit of the at least one row of pixel driving units; and the first electrode pattern and the second electrode pattern at least partially overlap in the direction perpendicular to a board surface of the base substrate and are insulated.

5. The display substrate according to claim 4, wherein the first electrode pattern is connected to the signal line through a hole to compensate a load capacitance of the signal line;

the second electrode pattern is connected to the first power line through a hole to receive the first power voltage.

6. The display substrate according to claim 5, wherein the plurality of light shielding patterns further comprise at least one second light shielding pattern;

wherein a first end of the at least one second light shielding pattern and the second electrode pattern are connected with each other and are formed integrally, a second end of the at least one second light shielding pattern at least partially overlaps with an intermediate region of at least one threshold compensation transistor of a first pixel driving unit of at least one row of pixel driving units adjacent to the second electrode pattern in the second direction in the direction perpendicular to the base substrate.

7. The display substrate according to claim 6, wherein a count of pixels of at least one row of pixel driving units adjacent to the first electrode pattern or the second electrode pattern in the second direction is smaller than a count of pixels of a row of pixel driving units adjacent to the first electrode pattern or the second electrode pattern in the first direction.

8. The display substrate according to claim 4, wherein the plurality of signal lines comprise a data line or a gate line.

9. The display substrate according to claim 8, wherein an orthographic projection of the data line on the base substrate at least partially overlaps with an orthographic projection of the storage capacitor on the base substrate.

10. The display substrate according to claim 1, further comprising a power connection line on a side of the peripheral region close to the outermost first pixel driving unit of the at least one row of pixel driving units;

wherein the power connection line is connected to the first power line through a hole to receive the first power voltage;

the plurality of light shielding patterns further comprise at least one third light shielding pattern;

a first end of the at least one third light shielding pattern is connected to the power connection line;

a second end of the at least one third light shielding pattern at least partially overlaps with an intermediate region of a threshold compensation transistor of a first pixel driving unit of at least one row of pixel driving units adjacent to the power connection line in the second direction in the direction perpendicular to the base substrate.

11. The display substrate according to claim 10, wherein a count of pixels of each row of pixel driving units adjacent to the power connection line in the second direction is smaller than a count of pixels of a row of pixel driving units adjacent to the power connection line in the first direction.

12. The display substrate according to claim 10, further comprising: a first transfer electrode, wherein a first end of the first transfer electrode is connected to the power connection line through a hole, and a second end of the first transfer electrode is connected to the at least one third light shielding pattern through a hole.

13. The display substrate according to claim 1, wherein a first end of the at least one light shielding pattern of the plurality of light shielding patterns is respectively connected to a first power line corresponding to the first pixel driving unit on the outmost side of the at least one row of pixel driving units to receive the first power voltage as the voltage signal.

14. The display substrate according to claim 1, further comprising an initialization signal line configured to provide an initialization signal to the plurality of pixel driving units; wherein the voltage signal comprises the initialization signal.

15. The display substrate according to claim 14, wherein each of the plurality of pixel driving units further comprises a first reset transistor and a second reset transistor;
a first electrode of the first reset transistor is connected to the initialization signal line to receive the initialization signal, a second electrode of the first reset transistor is connected to the threshold compensation transistor, and a gate electrode of the first reset transistor is connected to a first reset signal line to receive a first reset signal; and
a first electrode of the second reset transistor is connected to the initialization signal line to receive the initialization signal, a second electrode of the second reset transistor is connected to the first light-emitting control transistor, and a gate electrode of the second reset transistor is connected to a second reset signal line to receive a second reset signal.

16. The display substrate according to claim 15, further comprising a plurality of second transfer electrodes, a first insulation layer, a second insulation layer, and a third insulation layer,
wherein first ends of the plurality of second transfer electrodes are respectively connected to the initialization signal line to receive the initialization signal, second ends of the plurality of second transfer electrodes are respectively connected to first electrodes of first reset transistors of the outermost first pixel driving units of the respective rows of pixel driving units through holes penetrating through the first insulation layer, the second insulation layer, and the third insulation layer; and
first electrodes of first reset transistors of the outermost first pixel driving units are connected to the first ends of the plurality of light shielding patterns through holes penetrating through the first insulation layer and the second insulation layer, respectively.

17. The display substrate according to claim 15, wherein the pixel driving unit further comprises a driving transistor;
an active layer of the first reset transistor and an active layer of the driving transistor at least partially overlap with the first power line.

18. A display device, comprising the display substrate according to claim 1.

19. A display substrate, comprising:
a base substrate;
a display region, on the base substrate and comprising a plurality of pixel driving units arranged in a plurality of rows and a plurality of columns, wherein each of the plurality of pixel driving units comprises a threshold compensation transistor, a first light-emitting control transistor, and a storage capacitor, and the threshold compensation transistor is connected to the first light-emitting control transistor and the storage capacitor, respectively, the threshold compensation transistor comprises a first gate electrode and a second gate electrode, and an active layer of the threshold compensation transistor comprises a first channel region corresponding to the first gate electrode, a second channel region corresponding to the second gate electrode, and an intermediate region between the first channel region and the second channel region, the first channel region and the second channel region are connected through the intermediate region; and
a plurality of light shielding patterns, wherein each light shielding pattern comprises a first end and a second end, first ends of the plurality of light shielding patterns are used for receiving a voltage signal, a second end of at least one light shielding pattern in the plurality of light shielding patterns at least partially overlaps with an intermediate region of a threshold compensation transistor of an outermost first pixel driving unit of at least one row of pixel driving units in a direction perpendicular to the base substrate,
wherein a length of a light shielding pattern corresponding to the outermost first pixel driving unit of each row of pixel driving units is greater than a length of a light shielding pattern corresponding to a pixel driving unit except the outermost first pixel driving unit of each row of pixel driving units.

\* \* \* \* \*